United States Patent
Zhu

(10) Patent No.: US 10,978,470 B2
(45) Date of Patent: Apr. 13, 2021

(54) SEMICONDUCTOR DEVICE INCLUDING MULTIPLE LAYERS OF MEMORY CELLS, METHOD OF MANUFACTURING THE SAME, AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/338,212

(22) PCT Filed: Mar. 31, 2017

(86) PCT No.: PCT/CN2017/078972
§ 371 (c)(1),
(2) Date: Mar. 29, 2019

(87) PCT Pub. No.: WO2018/058926
PCT Pub. Date: Apr. 5, 2018

(65) Prior Publication Data
US 2020/0027897 A1    Jan. 23, 2020

(30) Foreign Application Priority Data

Sep. 30, 2016 (CN) .......................... 201610872740.3

(51) Int. Cl.
*H01L 27/11582* (2017.01)
*H01L 29/78* (2006.01)
(Continued)

(52) U.S. Cl.
CPC .... *H01L 27/11582* (2013.01); *H01L 21/0257* (2013.01); *H01L 21/30604* (2013.01);
(Continued)

(58) Field of Classification Search
CPC combination set(s) only.
See application file for complete search history.

(56) References Cited

U.S. PATENT DOCUMENTS

| 8,441,059 B2 | 5/2013 | Sim et al. |
| 8,895,393 B2 | 11/2014 | Sim et al. |

(Continued)

FOREIGN PATENT DOCUMENTS

| CN | 101651144 | 2/2010 |
| CN | 104022120 | 9/2014 |

(Continued)

OTHER PUBLICATIONS

International Search Report and Written Opinion, issued in the corresponding PCT application No. PCT/CN2017/078972, dated Aug. 3, 2017, 13 pages.

(Continued)

*Primary Examiner* — Nduka E Ojeh
(74) *Attorney, Agent, or Firm* — Hamre, Schumann, Mueller & Larson, P.C.

(57) ABSTRACT

The memory device includes multiple stacked layers of memory cells. Each of the layers includes a first array of first memory cells and a second array of second memory cells, which are nested with each other. The first memory cells and the second memory cells in the respective layers are substantially aligned to each other in a stacking direction of the memory cell layers. Each of the first memory cells is a vertical device based on a first source/drain layer, a channel layer, and a second source/drain layer stacked. Each of the second memory cells is a vertical device based on an active (Continued)

semiconductor layer extending in the stacking direction. The first and second memory cells include respective storage gate stacks, which share a common gate conductor layer. Gate conductor layers in the same memory cell layer are integral with each other.

34 Claims, 24 Drawing Sheets

(51) Int. Cl.
  *H01L 21/28* (2006.01)
  *H01L 21/02* (2006.01)
  *H01L 21/306* (2006.01)
  *H01L 27/11514* (2017.01)
  *H01L 27/11556* (2017.01)
  *H01L 29/04* (2006.01)
  *H01L 29/08* (2006.01)
  *H01L 29/10* (2006.01)
  *H01L 29/165* (2006.01)
  *H01L 29/423* (2006.01)
  *H01L 29/51* (2006.01)
  *H01L 29/66* (2006.01)
  *H01L 29/788* (2006.01)
  *H01L 29/792* (2006.01)

(52) U.S. Cl.
  CPC .. *H01L 27/11514* (2013.01); *H01L 27/11556* (2013.01); *H01L 29/04* (2013.01); *H01L 29/0847* (2013.01); *H01L 29/1037* (2013.01); *H01L 29/165* (2013.01); *H01L 29/40111* (2019.08); *H01L 29/40114* (2019.08); *H01L 29/40117* (2019.08); *H01L 29/4234* (2013.01); *H01L 29/42324* (2013.01); *H01L 29/516* (2013.01); *H01L 29/517* (2013.01); *H01L 29/6684* (2013.01); *H01L 29/66825* (2013.01); *H01L 29/66833* (2013.01); *H01L 29/7889* (2013.01); *H01L 29/78391* (2014.09); *H01L 29/7926* (2013.01)

(56) References Cited

U.S. PATENT DOCUMENTS

| | | | |
|---|---|---|---|
| 9,385,138 B2 | 7/2016 | Sim et al. | |
| 9,484,355 B2 | 11/2016 | Jung et al. | |
| 9,698,158 B2 | 7/2017 | Jung et al. | |
| 2009/0310425 A1 | 12/2009 | Sim et al. | |
| 2013/0242654 A1 | 9/2013 | Sim et al. | |
| 2015/0064865 A1 | 3/2015 | Sim et al. | |
| 2016/0013127 A1 | 1/2016 | Lai | |
| 2016/0027795 A1 | 1/2016 | Jung et al. | |
| 2016/0071593 A1* | 3/2016 | Hashimoto | G11C 16/30 365/185.33 |
| 2016/0172368 A1* | 6/2016 | Pang | H01L 27/11582 257/314 |
| 2016/0247819 A1 | 8/2016 | Sim et al. | |
| 2016/0365356 A1 | 12/2016 | Jung et al. | |
| 2020/0035696 A1* | 1/2020 | Zhu | H01L 27/11556 |

FOREIGN PATENT DOCUMENTS

| | | |
|---|---|---|
| CN | 105304633 | 2/2016 |
| CN | 106158877 | 11/2016 |
| CN | 106206600 | 12/2016 |
| CN | 106298679 | 1/2017 |
| CN | 106340521 | 1/2017 |

OTHER PUBLICATIONS

First Chinese Office Action, issued in the corresponding Chinese patent application No. 201610872740.3, dated Aug. 23, 2017, 11 pages.

* cited by examiner

US 10,978,470 B2

SEMICONDUCTOR DEVICE INCLUDING MULTIPLE LAYERS OF MEMORY CELLS, METHOD OF MANUFACTURING THE SAME, AND ELECTRONIC DEVICE INCLUDING THE SAME

CROSS-REFERENCE TO RELATED APPLICATION(S)

This application claims priority to Chinese Patent Application No. 201610872740.3, filed on Sep. 30, 2016, entitled "MEMORY DEVICE, METHOD OF MANUFACTURING THE SAME, AND ELECTRONIC DEVICE INCLUDING THE SAME," which is incorporated herein by reference in its entirety.

TECHNICAL FIELD

The present disclosure relates generally to the field of semiconductors, and more particularly, to a memory device based on vertical devices, a method of manufacturing the same, and an electronic device including the memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

However, it is difficult to control a gate length of the vertical device, especially if its channel has a monocrystalline material. On the other hand, if a polycrystalline material is used for the channel, the channel will has a greatly increased resistance, as compared to the monocrystalline material. Thereby, it is difficult to stack a plurality of vertical devices because this may lead to an excessively high resistance.

SUMMARY

In view of the above, the present disclosure aims to provide, among others, a memory device based on vertical devices, a method of manufacturing the same, and an electronic device including the memory device, with a better controlled gate length.

According to an aspect of the present disclosure, there is provided a memory device, comprising multiple layers of memory cells which are stacked on a substrate in sequence. Each of the multiple layers of memory cells comprises a first array of first memory cells and a second array of second memory cells. The first array and the second array are nested with each other. The respective first memory cells in the respective layers of memory cells are substantially aligned to each other in a stacking direction of the layers of memory cells, and the respective second memory cells in the respective layers of memory cells are substantially aligned to each other in a stacking direction of the layers of memory cells. Each of the first memory cells comprises a first source/drain layer, a channel layer, and a second source/drain layer which are stacked in sequence, and a first storage gate stack formed to surround a periphery of the channel layer. The channel layer comprises a semiconductor material different from that of the first and second source/drain layers. Gate conductor layers in the respective first storage gate stacks in the same layer of memory cells are integral with each other. For each of the first memory cells, the first source/drain layer thereof is integral with the second source/drain layer of a corresponding first memory cell at a lower layer, and the second source/drain layer thereof is integral with the first source/drain layer of a corresponding first memory cell at an upper layer. Each of the second memory cells comprises an active semiconductor layer, and a second storage gate stack formed to surround a periphery of the active semiconductor layer. For each of the second memory cells, the active semiconductor region thereof extends integrally with the respective active semiconductor layers of a corresponding second memory cell at a lower layer and a corresponding second memory cell at an upper layer. In the same layer of memory cells, the first storage gate stacks and the second storage gate stacks comprise a common gate conductor layer.

According to another aspect of the present disclosure, there is provided a method of manufacturing a memory device, comprising: providing a stack of source/drain layers and channel layers alternatively stacked on a substrate, wherein the lowermost layer of the stack is a source/drain layer, and the uppermost layer of the stack is a source/drain layer; forming a number of machining holes in the stack; selectively etching the channel layers in the stack through the machining holes, to form an array of multiple cell channel portions, which are separated from each other, in each of the channel layers of the stack; forming storage gate stacks for first memory cells in gaps in the stack through the machining holes; removing materials left in the machining holes to expose the machining holes; selectively etching the source/drain layers in the stack through the machining holes, to form cell source/drain portions respectively on upper and lower sides of each of the cell channel portions, wherein each of the cell channel portions and the cell source/drain portions on upper and lower sides thereof form a corresponding one of the first memory cells; forming an isolation layer in the gaps in the stack through the machining holes; removing materials left in the machining holes to expose the machining holes; and forming storage gate stacks for second memory cells on sidewalls of the machining holes, and filling an active semiconductor layer for the second memory cells in the machining holes of which the sidewalls have the storage gate stacks for the second memory cells formed thereon.

According to yet another aspect of the present disclosure, there is provided an electronic device, comprising the memory device described above.

According to embodiments of the present disclosure, the channel region is defined by the channel layer so that the gate length is determined by the thickness of the channel layer. The channel layer may be formed by, for example, epitaxial growth so that its thickness can be well controlled. Therefore, the gate length can be well controlled. In addition, the channel layer may comprise a monocrystalline semiconductor material which may have a high carrier mobility and low leakage current, thereby improving the device performances. Since vertical devices can be stacked on each other relatively easily, a three-dimensional memory device can be manufactured, thereby increasing the storage density. In addition, memory cells are additionally formed in the machining holes, which facilitates saving the wafer area.

BRIEF DESCRIPTION OF THE DRAWINGS

The above and other objects, features, and advantages of the present disclosure will become more apparent from following descriptions of embodiments thereof with reference to attached drawings, in which.

Throughout the drawings, like or similar reference numbers denote like or similar elements.

DETAILED DESCRIPTION

Figure 1:
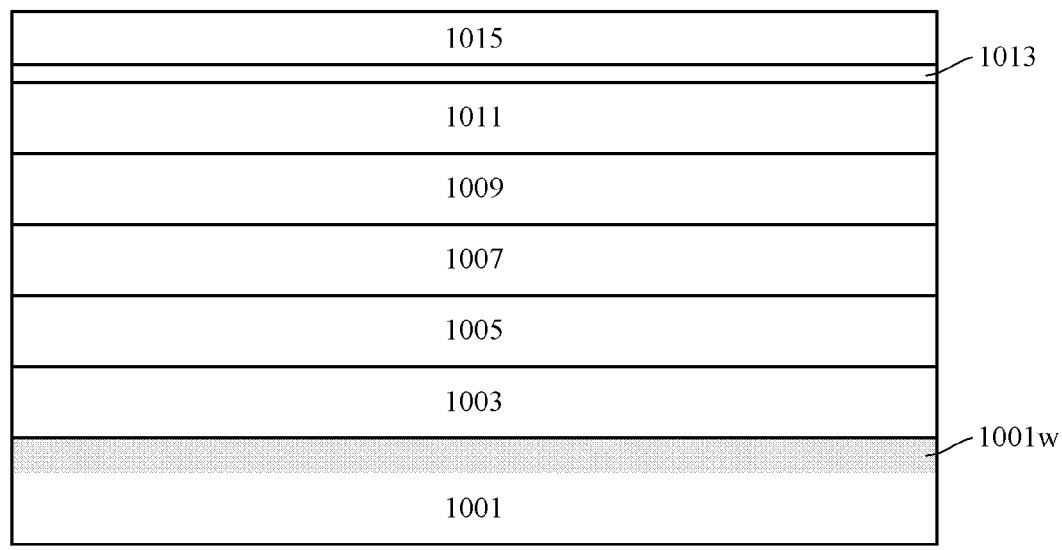
FIGS. 1-16(b) are schematic views showing a flow of manufacturing a memory device according to an embodiment of the present disclosure.
Figure 2:
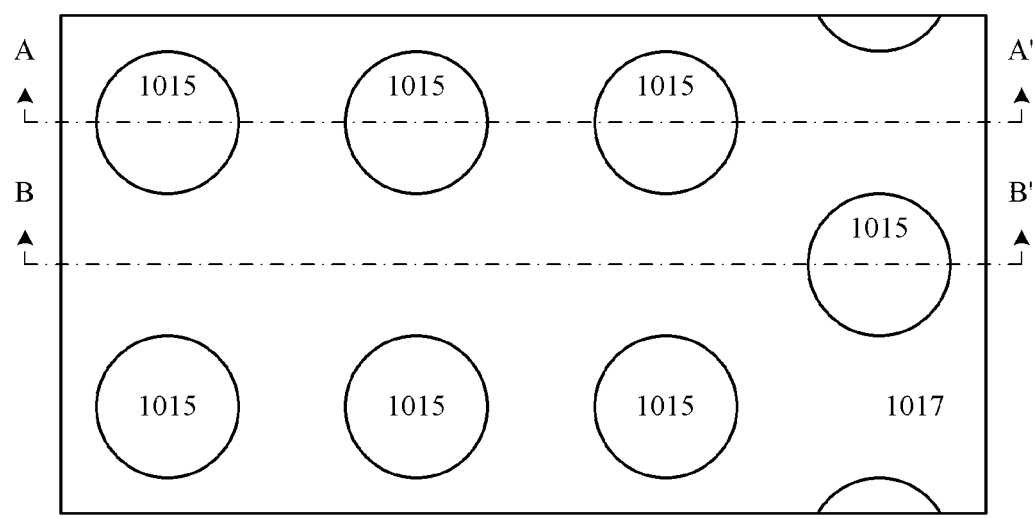

Hereinafter, descriptions are given with reference to embodiments shown in the attached drawings. However, it is to be understood that these descriptions are illustrative only and not intended to limit the present disclosure. Further, in the following, descriptions of known structures and technologies are omitted to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations therefrom may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A memory device according to an embodiment of the present disclosure is based on vertical devices. Specifically, each of memory cells (which may be referred to as first memory cells) in the memory device is a vertical device, and comprises a first source/drain layer, a channel layer and a second source/drain layer which are stacked in sequence. A gate stack may be formed to surround a periphery of the channel layer. Here, the gate stack may be a storage gate stack, which may comprise, for example, a floating gate layer or charge trapping layer or a ferroelectric material in order to achieve a storage function. For example, the gate stack may comprise a first gate dielectric layer, a floating gate layer or charge trapping layer, a second gate dielectric layer and a gate conductor layer which are stacked in sequence, or may comprise a first metal layer, a ferroelectric material layer, a second metal layer, a gate dielectric layer and a gate conductor layer which are stacked in sequence. Source/drain regions of the device may be formed in the first source/drain layer and the second source/drain layer, and a channel region of the device may be formed in the channel layer. A conductive channel may be formed by the channel region between the source/drain regions on opposite sides of the channel region. Here, the memory cell may be a flash cell.

As a result, a gate length may be determined by a thickness of the channel layer itself, rather than depending on etching timing as in the conventional art. The channel layer may be formed by, for example, epitaxial growth, so that its thickness may be well controlled. Therefore, the gate length may be well controlled. The channel layer may be formed of a monocrystalline semiconductor material to improve the device performances. In particular, a channel resistance may be reduced, thereby facilitating stacking the vertical devices on each other. Certainly, the first source/drain layer and the second source/drain layer may also be formed of a monocrystalline semiconductor material. In this case, the monocrystalline semiconductor material of the channel layer and the monocrystalline semiconductor material of the first source/drain layer and the second source/drain layer may be eutecticum.

The memory device according to the embodiment of the present disclosure may be a three-dimensional (3D) array due to the characteristics that vertical devices are easy to be stacked. Specifically, the memory cells may be arranged not only in a plane (for example, substantially parallel to a surface of the substrate) but also in a vertical direction (for example, substantially perpendicular to the surface of the substrate). Thus, the memory device may comprise multiple layers of memory cells which are stacked on the substrate in sequence. Each of the multiple layers of memory cells may comprise an array of memory cells (for example, a two-dimensional array typically arranged in rows and columns), and memory cells in the respective layers of memory cells may be substantially aligned to each other in a stacking direction of the layers of memory cells. In addition, corresponding memory cells may be connected in a string in the stacking direction of the layers of memory cells (the vertical direction, typically substantially perpendicular to the surface of the substrate). This connection may be achieved by sharing source/drain layers between the respective memory cells.

According to an embodiment of the present disclosure, the channel layer may comprise a semiconductor material different from that of the first source/drain layer and the second source/drain layer. Thus, it facilitates processing the channel layer and the source/drain layers separately. In addition, the first source/drain layer and the second source/drain layer may comprise the same semiconductor material.

A periphery of the channel layer may be recessed inward with respect to peripheries of the first source/drain layer and the second source/drain layer, so that the formed gate stack may be embedded in a recess of the channel layer with respect to the first source/drain layer and the second source/drain layer, to facilitate reducing an overlap between the gate stack and the source/drain layers so as to reduce parasitic capacitance between the gate and the source/drain.

Such a memory device may be manufactured as follows, for example. Specifically, a stack of alternatively stacked source/drain layers and channel layers may be provided on the substrate, wherein the lowermost layer of the stack may be a source/drain layer, and the uppermost layer of the stack may also be a source/drain layer. For example, these layers may be provided by epitaxial growth. During the epitaxial growth, each of the grown channel layers may have its thickness controlled. In addition, during the epitaxial growth, in-situ doping may be performed to achieve a desired doping conductivity and a desired doping concentration.

In order to facilitate processing the layers in the stack, a number of machining holes may be formed in the stack. These machining holes may extend in a stacking direction of the stack (i.e., a vertical direction), and all the channel layers may have their respective sidewalls exposed in the machining holes. In the following processes, these machining holes are working paths.

Each of the channel layers in the stack may be selectively etched through the machining holes. As the selective etching goes on in all directions from the respective machining holes, portions of the channel layer may be left at positions between the respective machining holes while substantially all other portions of the channel layer at other positions may be removed by controlling an amount of the etching. The remaining portions of the channel layer may be used as channels for memory cells, and thus are referred to herein as cell channel portions. By setting a layout of the machining holes (which may be referred to as a first array), an array of cell channel portions (which may be referred to as a second array) may be left in each of the channel layers. Further, as the machining holes extend in the stacking direction of the stack (i.e., the vertical direction), the etching in the respective channel layers goes on laterally to substantially the same extent. As a result, the arrays of cell channel portions remaining in the respective channel layers are substantially the same, and the cell channel portions in the respective arrays may be substantially aligned in the stacking direction of the stack (i.e., the vertical direction).

Storage gate stacks may be formed in gaps in the stack through the machining holes. For example, a first gate dielectric layer, a floating gate layer or charge trapping layer, a second gate dielectric layer and a gate conductor layer may be formed in sequence, thereby forming the storage gate stacks. Due to the presence of the upper and lower source/drain layers, the storage gate stacks are filled in gaps between the respective source/drain layers, i.e., at positions where the channel layers were originally located, to be self-aligned with the cell channel portions.

Hereto, a channel (which is provided by the cell channel portion), the gate stack, and source/drain regions (which are provided by the source/drain layers above and below the cell channel portion) are all prepared for each of the memory cells, but the source/drain regions of the respective memory cells are connected to each other (in this case, the respective source/drain layers are contiguous except for the machining holes). To this end, each of the source/drain layers in the stack may be selectively etched through the machining holes by removing (preceded by exposing the machining holes by removing materials filled therein, for example, the gate stack described above). Similarly, portions of the source/drain layer may be left at positions between the respective machining holes while substantially all other portions of the source/drain layer at other positions may be removed by controlling an amount of the etching. As the etching is performed through the same machining holes, the etching goes on in all directions from the respective machining holes in the same manner (possibly at different speeds, i.e., etching speeds, but along substantially the same path, i.e., etching path) as the etching of the channel layers, so that the remaining portions of the source/drain layers are substantially aligned with the respective portions previously left in the channel layers in the vertical direction. As a result, the remaining portions of the source/drain layers are respectively located on the top and bottom surfaces of the respective cell channel portions, thereby forming cell source/drain portions for the respective memory cells.

Subsequently, an isolation layer may be further formed on the device. At the same time, the isolation layer may move into the stack through the machining holes, to be filled in the gaps in the stack. In addition, various electrical contacts may be further formed.

According to an embodiment of the present disclosure, additional memory cells (which may be referred to as second memory cells) may be further formed in the machining holes. For example, a storage gate stack for a second memory cell may be formed on the sidewalls of each of the machining holes (preceded by exposing the machining holes by removing materials filled therein, such as the above isolation layer), and then an active semiconductor layer for the second memory cell may be filled in the machining hole of which the sidewalls have the storage gate stack for the second memory cell formed thereon. As a result, the active semiconductor layer of the second memory cell may extend along an extending direction of the machining hole (i.e., the vertical direction), and the storage gate stack of the second memory cell may extend along the sidewalls of the machining hole (i.e., the vertical direction) and form concentric rings around the active semiconductor layer.

Here, it suffices to form only another first gate dielectric layer, another charge trapping layer, and another second gate dielectric layer for the second memory cells on the sidewalls of the machining holes, without additionally forming a gate conductor layer. As described above, the gate stacks of the first memory cells are filled in the gaps between the respective source/drain layers, that is, at the positions where the channel layers were originally located. As a result, the gate conductor layers in the respective gate stacks of the first memory cells are exposed on the sidewalls of the machining holes, and thus are in physical contact with the other first gate dielectric layer, the other charge trapping layer, and the other second gate dielectric layer of the second memory cells, so as to act as a gate conductor layer for the second memory cells. Therefore, at the same level, the gate conductor of the first memory cells and the gate conductor of the second memory cells may be integral with each other.

In addition, the extending direction of the storage gate stacks (particularly, the gate conductor layers therein) of the first memory cells (i.e., the extending direction of the channel layer, for example, a direction substantially parallel to the substrate surface) intersects (for example, is perpendicular to) the extending direction of the storage gate stacks of the second memory cells (i.e., the extending direction of the machining holes, that is, the vertical direction). As a result, the gate conductor layer defines a channel region at a position in the active semiconductor layer corresponding to the channel layer, and source/drain regions may be formed on opposite sides of the channel region (positions in the active semiconductor layer corresponding to the upper and lower source/drain layers, respectively).

The technology of the present disclosure can be implemented in various ways, some of which are exemplified in the following with reference to the drawings.

FIGS. 1-16(b) are schematic views showing a flow of manufacturing a memory device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as a SiGe substrate, or the like. Hereinafter, the bulk Si substrate will be described by way of example for convenience of description.

In the substrate 1001, a well region 1001w may be formed by, for example, ion implantation. The well region 1001w may then act as a common ground potential plane of the memory device to which lower source/drain regions of respective memory cells in the memory device at the lowermost level may be connected. The well region 1001w may be doped into n-type if the memory cells are n-type devices or into p-type if the memory cells are p-type devices, or to have the same conductivity as channel regions if the memory cells are junctionless devices.

A first source/drain layer 1003, a first channel layer 1005, a second source/drain layer 1007, a second channel layer 1009, and a third source/drain layer 1011 may be formed in sequence on the substrate 1001 by, for example, epitaxial growth. As an example, for the p-type devices, the first source/drain layer 1003, the second source/drain layer 1007, and the third source/drain layer 1011 may each comprise a suitable semiconductor material such as SiGe (with an atomic percentage of Ge being about 10-40%), with a thickness of about 20-50 nm; and the first channel layer 1005 and the second channel layer 1009 may each comprise a semiconductor material such as Si, which is different from that of the source/drain layers 1003, 1007 and 1011, with a thickness of about 10-100 nm. SiGe has a greater lattice constant than Si, without being strained. The materials for the source/drain layers and the channel layers are not limited thereto. Other semiconductor materials are also possible as long as they can provide appropriate etching selectivity. For example, for an n-type device, the source/drain layers may each comprise Si:C (with an atomic percentage of C being about 0.1-5%), and the channel layers each may comprise Si. Si:C has a smaller lattice constant than Si, without being strained. Certainly, the present disclosure is not limited thereto. For example, the channel layers may each comprise a semiconductor material, with the same components as the source/drain layers, but with different contents of the components from the source/drain layers (for example, they all comprise SiGe, but with different atomic percentages of Ge), as long as the channel layers have etching selectivity with respect to the source/drain layers.

Each of the source/drain layers 1003, 1007 and 1011 may be in-situ doped while being grown, to form source/drain regions later. For example, for the n-type devices, n-type doping may be performed; and for the p-type devices, p-type doping may be performed.

In addition, each of the channel layers 1005 and 1009 may also be in-situ doped while being grown, to adjust a threshold voltage (Vt) of the respective devices. For example, for the n-type devices, p-type doping may be performed; and for the p-type devices, n-type doping may be performed.

Further, for the junctionless devices, the same type of doping may be performed on the source/drain layers and the channel layers.

In this example, the first source/drain layer 1003 is additionally grown on the substrate 1001. However, the present disclosure is not limited thereto. For example, the first source/drain layer may be provided by the substrate 1001 itself. In addition, more source/drain layers and more channel layers may be formed to form more layers of memory cells.

In addition, a hard mask may be further formed on these grown semiconductor layers for convenience of patterning in subsequent processes or providing an appropriate stopper layer. For example, an oxide (for example, silicon oxide) layer 1013 (with a thickness of, for example, about 2-10 nm) and a nitride (for example, silicon nitride) layer 1015 (with a thickness of, for example, about 10-100 nm) may be formed in sequence.

Subsequently, machining holes may be defined. As shown in a top view of FIG. 2, photoresist 1017 may be formed on the structure shown in FIG. 1. The photoresist 1017 may be patterned by photolithography (exposure and development) to expose the underlying nitride layer 1015 at positions where the machining holes are to be formed. Arrangement of the machining holes will be described in further detail below.

Figure 3A:
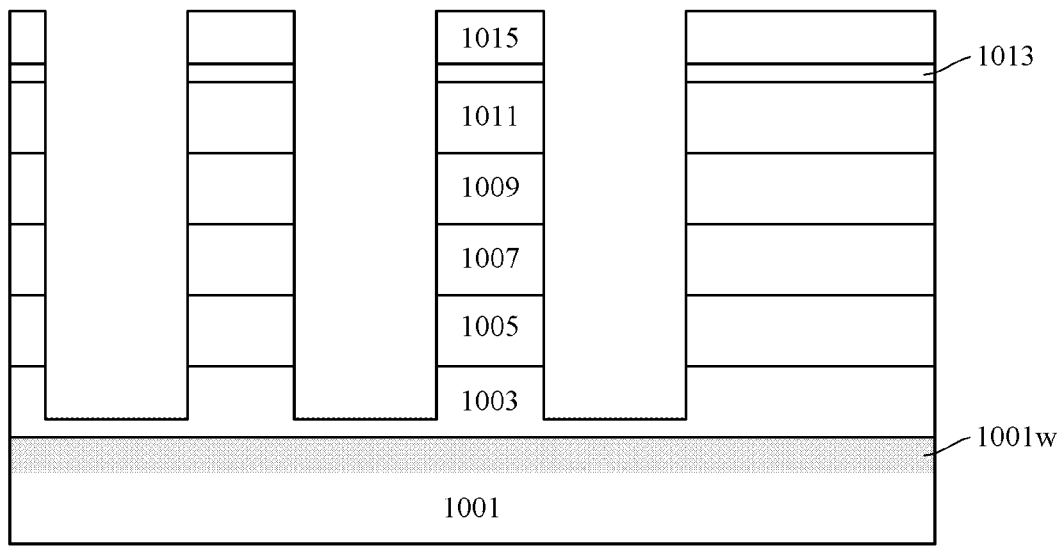
Figure 3B:
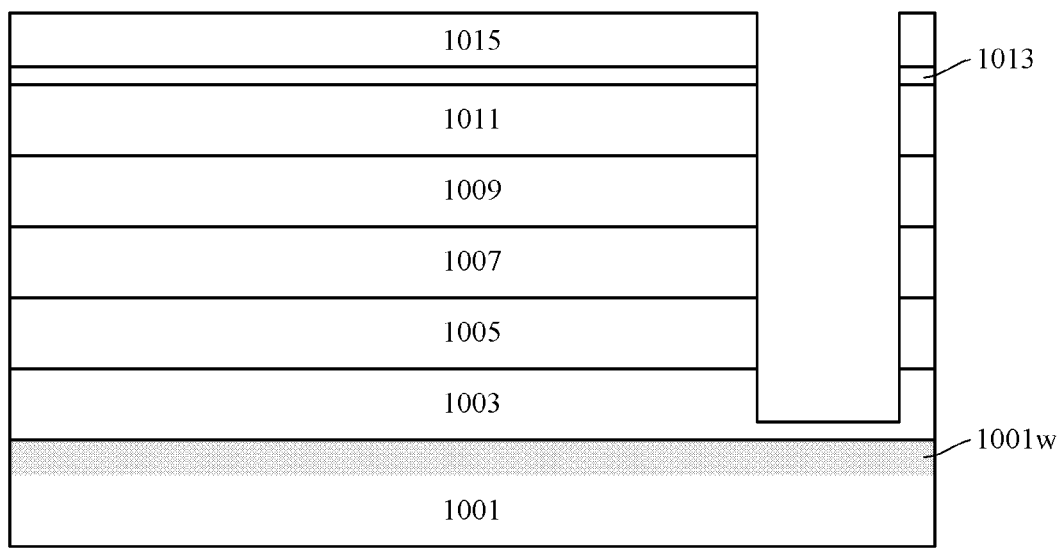

Next, as shown in FIG. 3(a) (a cross-sectional view taken along line AA' in FIG. 2) and FIG. 3(b) (a cross-sectional view taken along line BB' in FIG. 2), holes may be formed downwards through the photoresist. Specifically, the nitride layer 1015, the oxide layer 1013, the third source/drain layer 1011, the second channel layer 1009, the second source/drain layer 1007, the first channel layer 1005 and the first source/drain layer 1003 may be selectively etched by, for example, Reactive Ion Etching (RIE) in sequence to form the machining holes. For example, the RIE may be performed in a direction substantially perpendicular to a surface of the substrate, so that the machining holes extend in the direction substantially perpendicular to the substrate surface. After that, the photoresist 1017 may be removed. In this example, a portion of the first source/drain layer 1003 remains at the bottom of the machining holes for better contact with the ground potential plane. However, the present disclosure is not limited thereto. For example, the machining holes may pass through the stack of the channel layers and the source/drain layers. These machining holes form working paths to the respective layers in the stack.

Figure 4A:
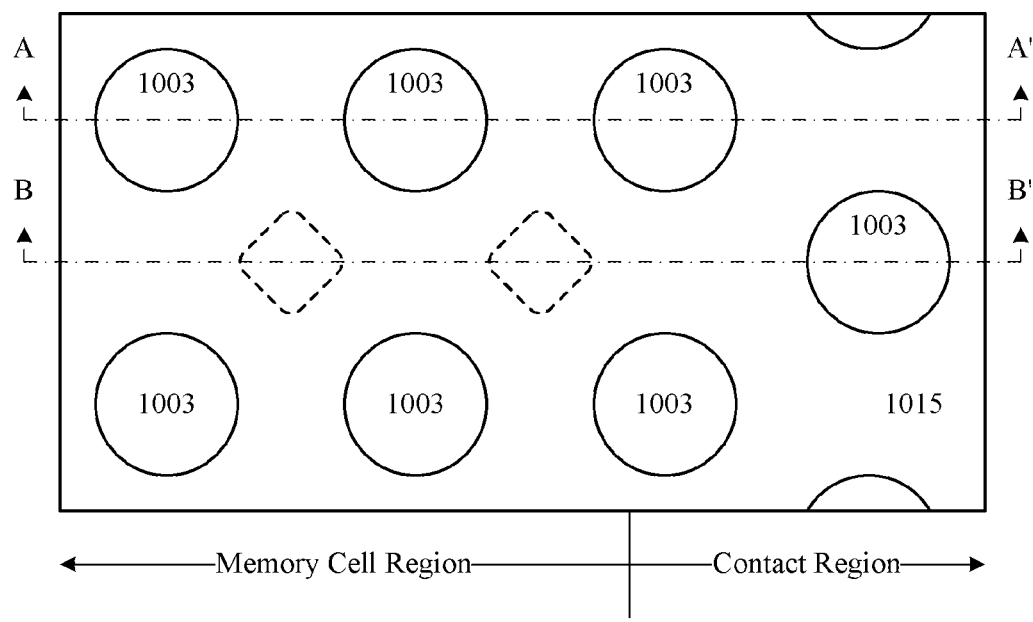
Figure 4B:
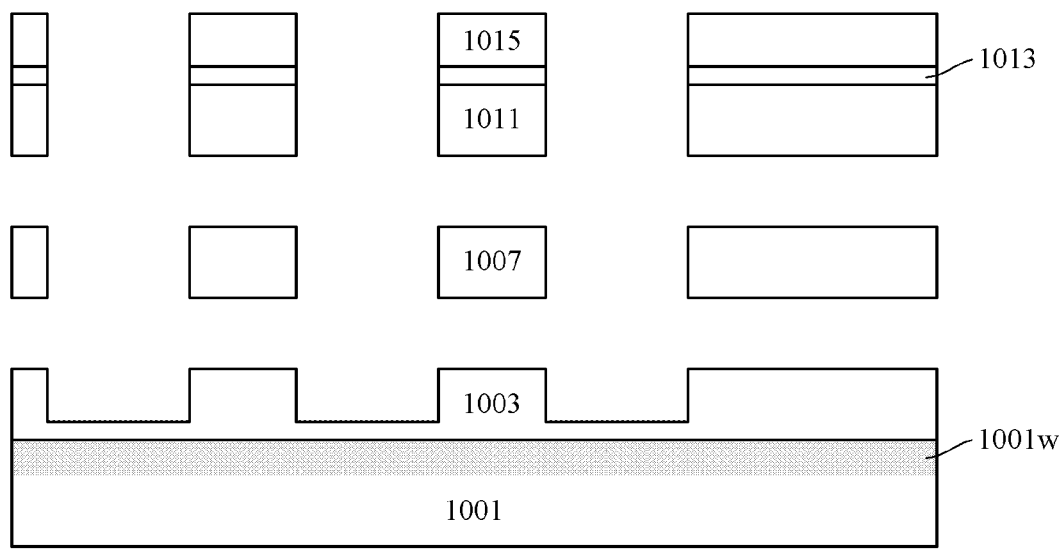
Figure 4C:
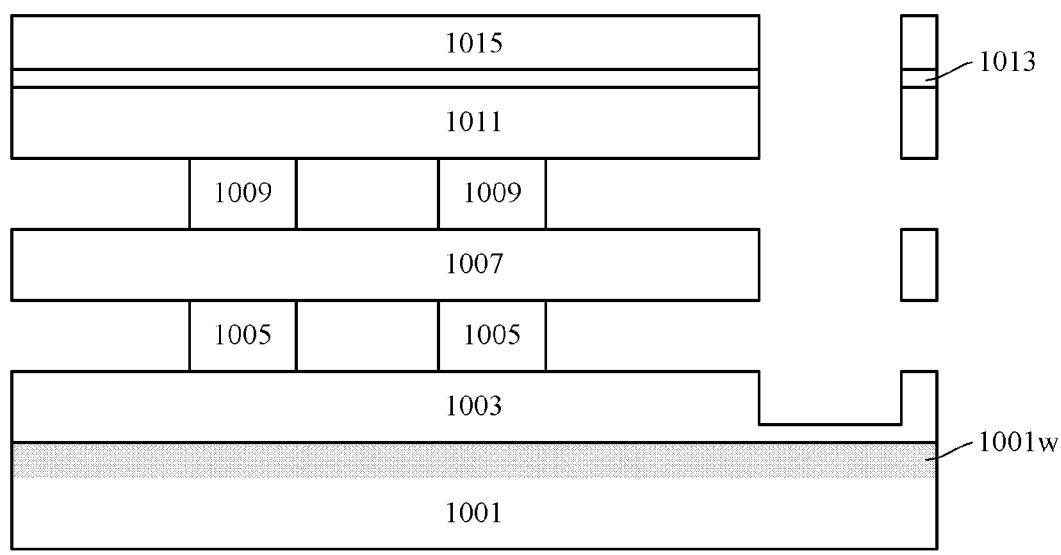

Then, as shown in FIGS. 4(a), 4(b) and 4(c) (FIG. 4(a) is a top view, FIG. 4(b) is a cross-sectional view taken along line AA' in FIG. 4(a), and FIG. 4(c) is a cross-sectional view taken along line BB' in FIG. 4(a)), the channel layers 1005 and 1009 may be selectively etched (with respect to the source/drain layers) through the machining holes. For example, a suitable etchant may be selected, so that the channel layers (of Si in this example) are etched (much) more than the source/drain layers (of SiGe in this example). In an example, particularly in a case that the source/drain layers comprise Si and the channel layers comprise SiGe, digital etching may be used. Specifically, a surface oxide layer may be formed on surfaces of the source/drain layers of Si and the channel layers of SiGe by heat treatment, and then the surface oxide layer may be removed by etching. SiGe has an oxidation rate higher than that of Si, and also the oxide of SiGe is easier to be removed. The oxidation and the removal of the oxide may be repeated to achieve a desired recess. This approach allows for better control of the recess than selective etching.

Here, the amount of the etching may be controlled, to form a plurality of separate portions in each of the channel layers 1005 and 1009 (see the dotted blocks in the top view of FIG. 4(a) and the cross-sectional view of FIG. 4(c)), and these portions are subsequently used as cell channel portions of the memory cells.

Here, the arrangement of the machining holes and a corresponding etching effect will be described with reference to FIGS. 17(a) and 17(b).

Figure 17A:
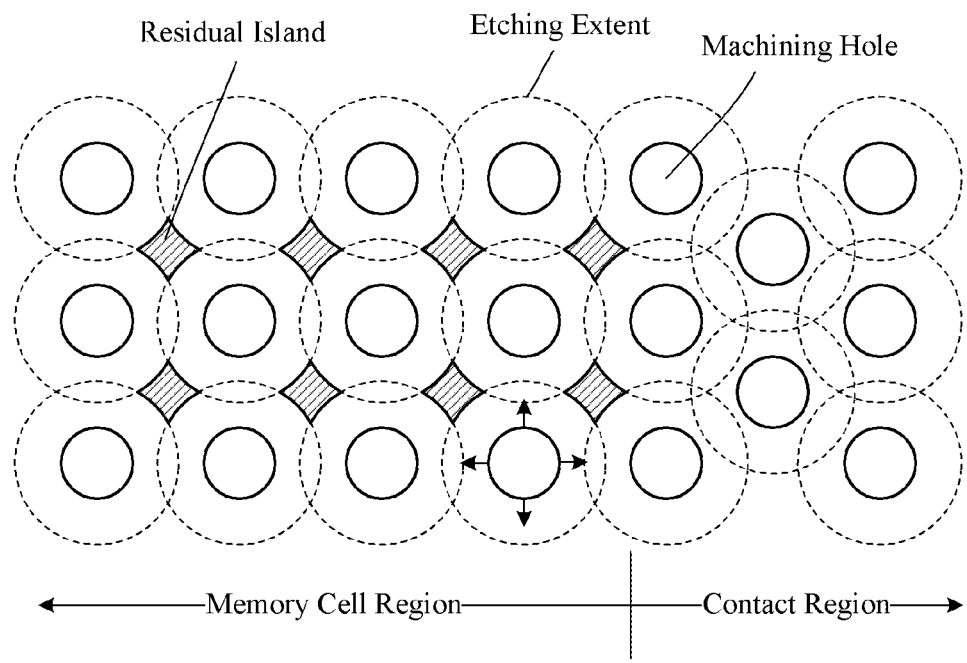
FIGS. 17(a) and 17(b) are schematic views showing arrangement of machining holes according to an embodiment of the present disclosure.
Figure 17B:
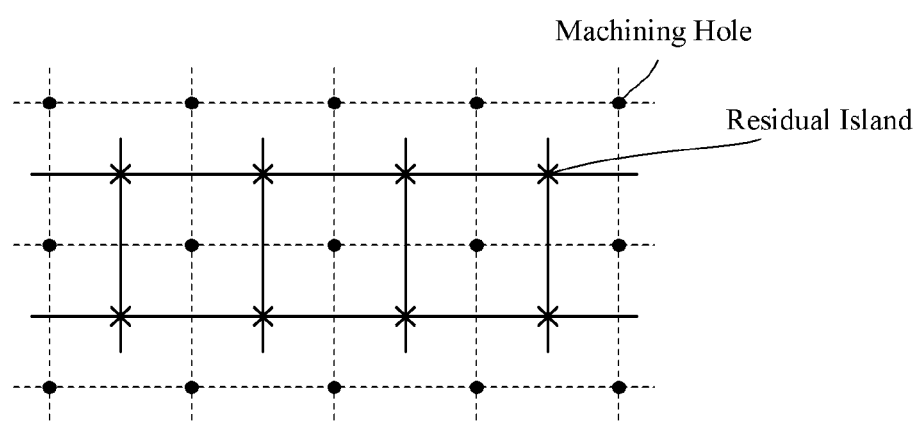

As shown in FIGS. 4(a) and 17(a), the substrate may comprise a memory cell region in which the memory cells are to be formed and a contact region in which electrical contacts are to be formed. Certainly, the substrate may further comprise other regions, such as a circuit region for relevant circuits, or the like.

According to an embodiment of the present disclosure, the machining holes may be provided in the memory cell region at such a density that portions of the channel layers in the memory cell region may be separated into isolated islands after the channel layers have been selectively etched through the machining holes for a given period of time. The etching goes on in all directions from the respective machining holes, as indicated by the arrows in FIG. 17(*a*). Without considering the directionality (i.e., assuming that the etching is isotropic), an extent reached by the etching at any given time point is a circle centered on each of the machining holes, as indicated by dotted circles in the figure. The etching extent (i.e., a radius of the circle) may be controlled by an amount of etching (for example, etching time). By controlling the amount of etching, the etching extent from the respective machining holes may define residual islands between the machining holes.

In addition, the machining holes may be provided in the contact region at such a density that substantially all portions of the channel layers in the contact region are removed after the given period of time. More specifically, the machining holes are arranged more densely in the contact region than in the memory cell region, so that the etching extents from the respective machining holes overlap each other to cover the entire contact region. Certainly, in order to provide support for the source/drain layers in subsequent processes, the density of the machining holes may be reduced in some areas of the contact region, so that there may also be residual islands in these areas, similar to those in the memory cell region.

Although the isotropic etching is described by way of example here, the present disclosure is not limited thereto. In a case of anisotropic etching, the arrangement of the machining holes may be designed in consideration of directionality of the etching.

FIG. 17(*b*) schematically shows a relationship between an array of the machining holes (i.e., an array of dots in the figure) and an array of the resultant islands (i.e., an array of "x"'s in the figure). In a case of a conventional two-dimensional array of memory cells arranged in rows and columns, the machining holes may be arranged in a corresponding two-dimensional array. Those two arrays may be nested with each other. More specifically, each of the islands may be located at an approximate center of a corresponding grid of the machining holes, and each of the machining holes may be located at an approximate center of a corresponding grid of the islands.

In this example, the grid of the machining holes is quadrilateral. However, the present disclosure is not limited thereto. The grid of the machining holes may also have other shapes, for example, a triangle or other polygons, and a corresponding island may be located approximately at a geometric center thereof. Certainly, the machining holes are not limited to have a circular shape, but may also have other shapes, preferably a regular polygon, which is convenient for layout design.

Returning back to FIGS. 4(*a*)-4(*c*), as described above, most portions of the channel layers 1005 and 1009 are removed after being etched for the given period of time, so that only some isolated islands remain to act as the cell channel portions. As the machining holes pass through the stack vertically, the remaining islands are at almost the same positions in the respective channel layers (centers of the respective grids of the machining holes as shown in FIG. 17(*b*)), and therefore these islands are substantially aligned with each other in the vertical direction.

In addition, spaces (which are originally occupied by the channel layers) are left between the source/drain layers 1003, 1007 and 1009. Gate stacks may be formed in these spaces. As a result, the gate stacks may be self-aligned to the respective cell channel portions.

Figure 5A:
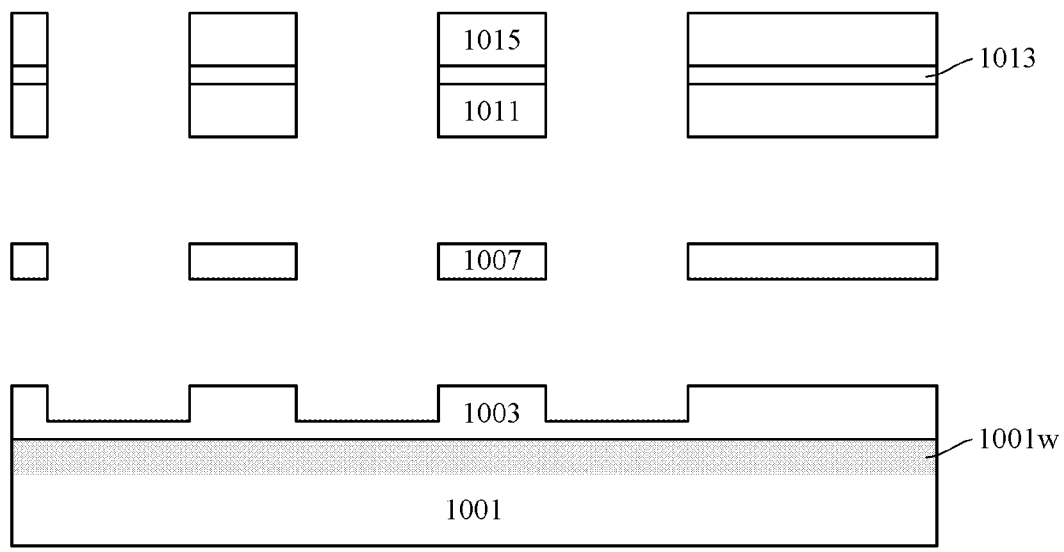
Figure 5B:
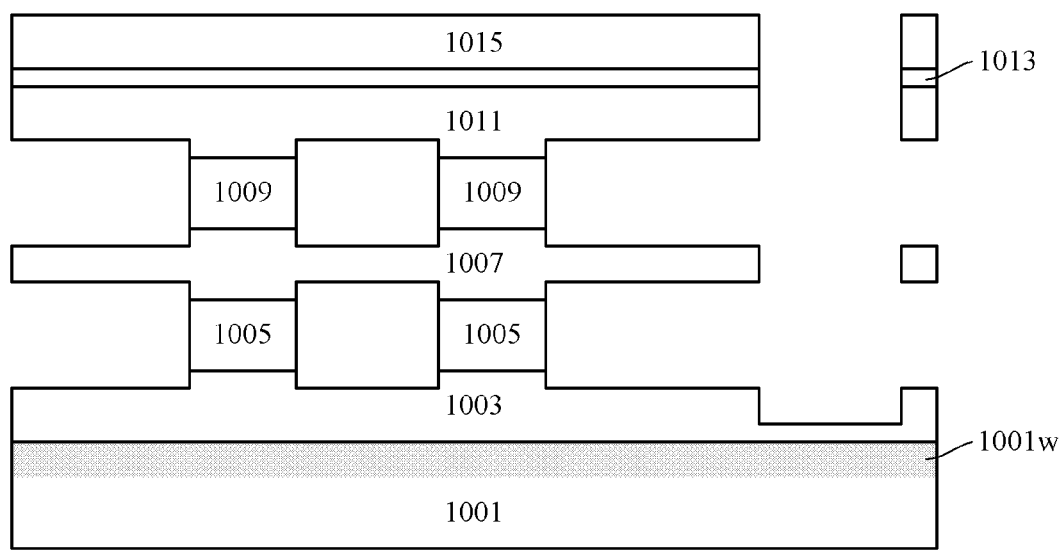

For ease of fabrication, as shown in FIGS. 5(*a*) and 5(*b*), the source/drain layers 1003, 1007 and 1011 may be selectively etched (with respect to the channel layers) through the machining holes. Due to the removal of the channel layers so that the spaces are left between the source/drain layers as described above, the etchant may move into these spaces through the machining holes. Therefore, unlike the etching of the channel layers in all directions from the machining holes, this etching step mainly cause the source/drain layers to be reduced in thickness. As a result, gaps between the source/drain layers may be enlarged, which facilitates subsequently filling the gaps.

Figure 6A:
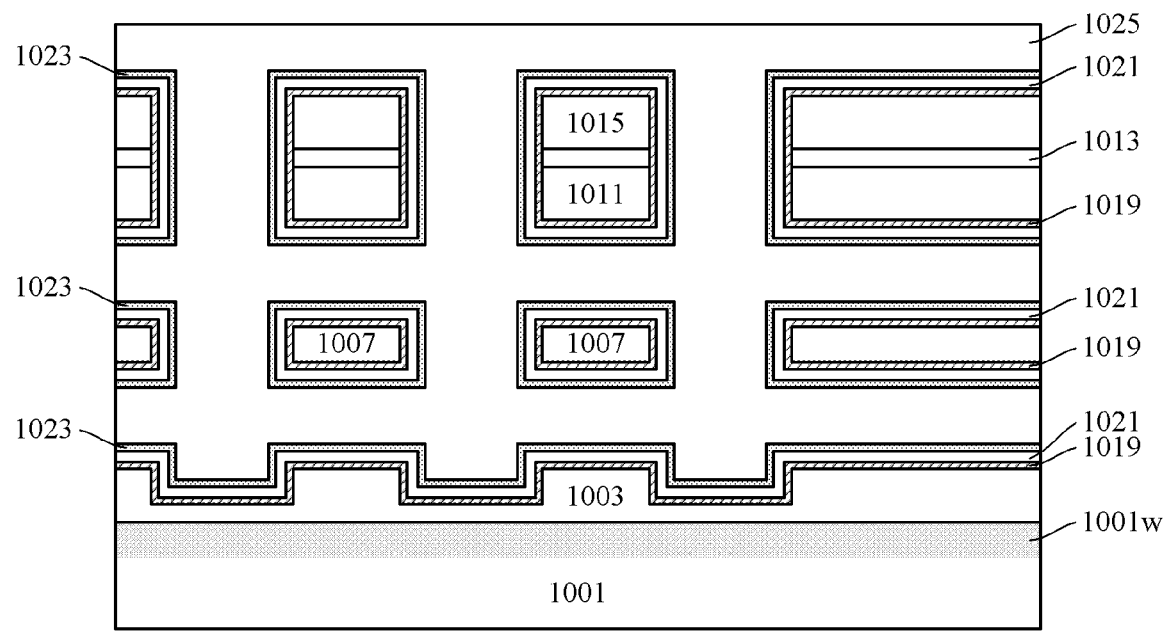
Figure 6B:
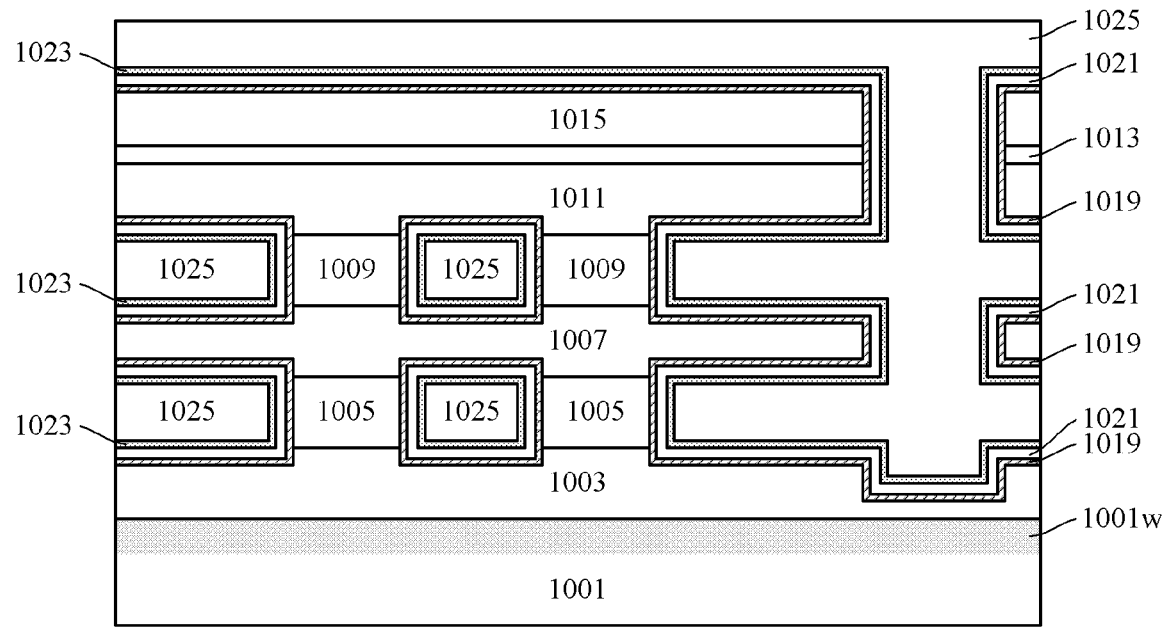

Next, as shown in FIGS. 6(*a*) and 6(*b*), storage gate stacks may be formed in the gaps in the stack through the machining holes. For example, a first gate dielectric layer 1019, a floating gate layer or charge trapping layer 1021, a second gate dielectric layer 1023, and a gate conductor layer 1025 may be formed in sequence. For example, the first gate dielectric layer 1019 may comprise high-K gate dielectric such as $HfO_2$, with a thickness of about 1-10 nm, the floating gate layer or charge trapping layer 1021 may comprise a floating gate material such as metal or a charge trapping material such as nitride, with a thickness of about 1-20 nm, the second gate dielectric layer 1023 may comprise high-K gate dielectric such as $HfO_2$, with a thickness of about 1-10 nm, and the gate conductor layer 1025 may comprise a metal gate conductor. Here, the first gate dielectric layer 1019, the floating gate layer or charge trapping layer 1021, and the second gate dielectric layer 1023 are relatively thin and may be formed in a substantially conformal manner, and the gate conductor layer 1025 may be relatively thick to fill up the gaps in the stack. In addition, a work function adjustment layer (not shown) may be further formed between the second gate dielectric layer 1023 and the gate conductor layer 1025.

As shown in FIG. 6(*b*), the thus formed gate stacks occupy the positions of the channel layers, and thus are self-aligned to the respective cell channel portions 1005 and 1009. Moreover, in one same channel layer, the cell channel portions 1005 or 1009 are separated islands, and all remaining positions in this layer are occupied by the gate stacks. Therefore, in the top view, the gate stacks are integrally formed in that channel layer and surround the respective cell channel portions 1005 or 1009.

Alternatively, the gate stacks may comprise a ferroelectric material. For example, the gate stacks may each comprise a first metal layer, a ferroelectric material layer, a second metal layer, a gate dielectric layer, and a gate conductor layer (not shown) which are stacked in sequence. For example, the ferroelectric material may comprise hafnium oxide such as $HfO_2$, zirconium oxide such as $ZrO_2$, tantalum oxide such as $TaO_2$, hafnium zirconium oxide $Hf_xZr_{1-x}O_2$ (wherein x is in a range of 0 to 1) such as $Hf_{0.5}Zr_{0.5}O_2$, hafnium tantalum oxide $Hf_xTa_{1-x}O_2$ (wherein x is in a range of 0 to 1) such as $Hf_{0.5}Ta_{0.5}O_2$, Si-containing $HfO_2$, Al-containing $HfO_2$, $BaTiO_3$, $KH_2PO_4$ or SBTi, and the first metal layer and the second metal layer may each comprise TiN. In this case, the first metal layer, the ferroelectric material layer, the second metal layer, and the gate dielectric layer may be formed in sequence through the machining holes. These layers may be relatively thin, and may be formed in a substantially conformal manner. In addition, the gate conductor layer may be formed through the machining holes, and may be relatively thick so as to fill up the gaps in the stack.

Figure 7A:
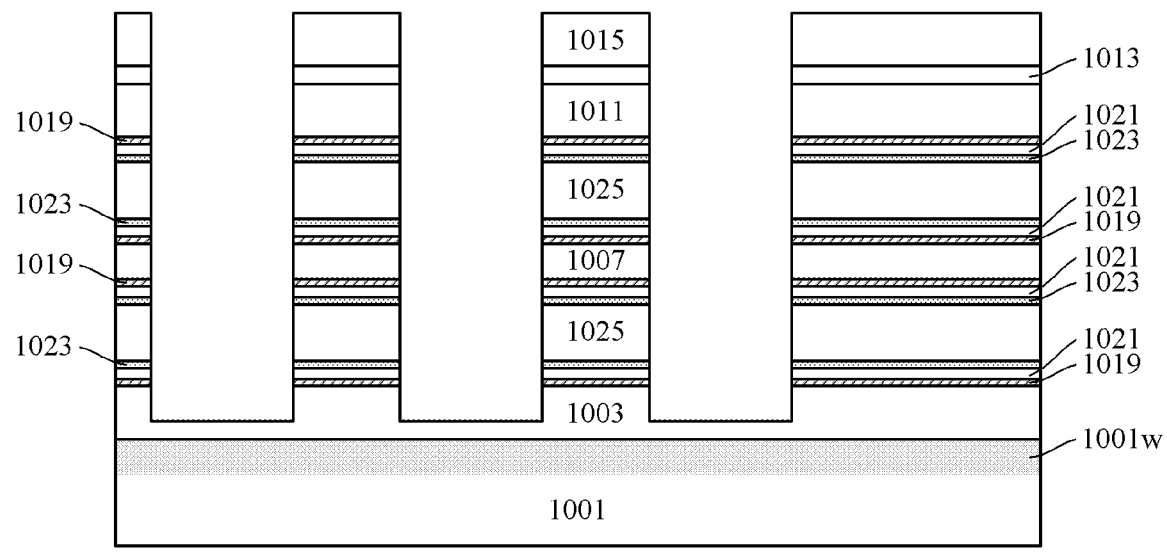
Figure 7B:
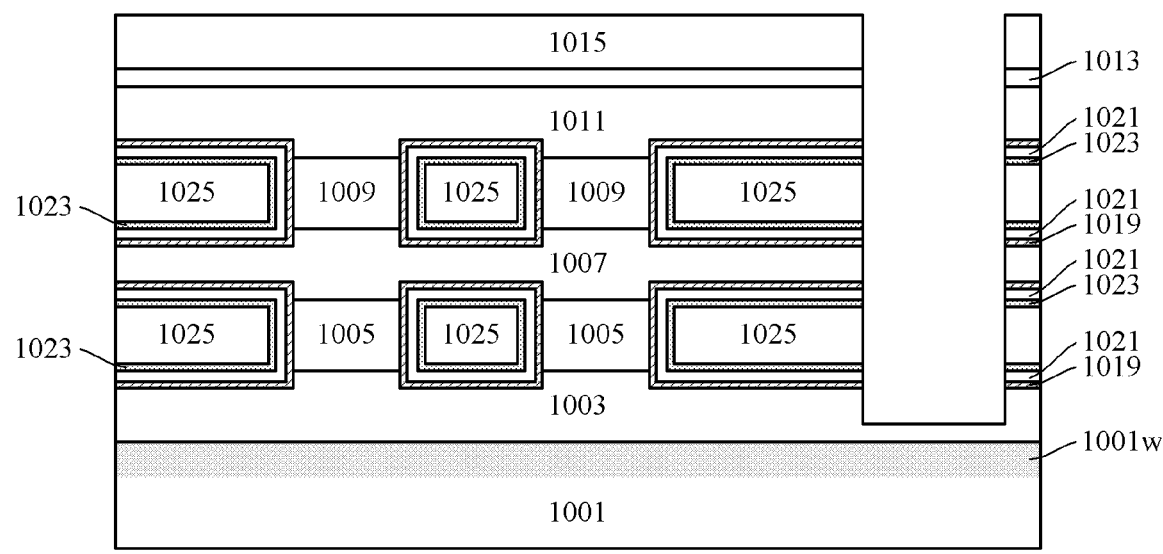
Figure 8A:
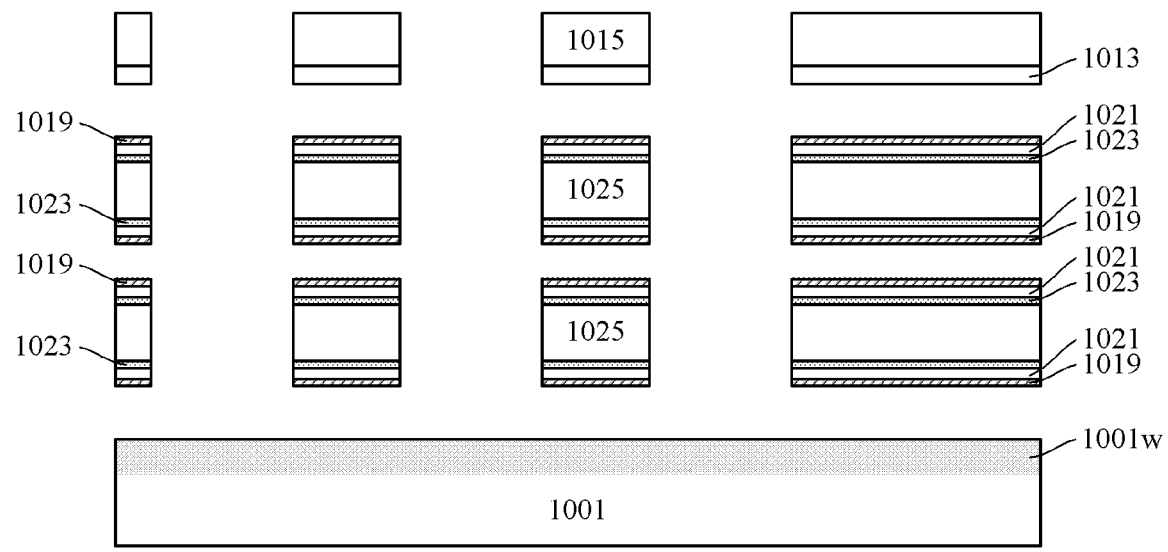
Figure 8B:
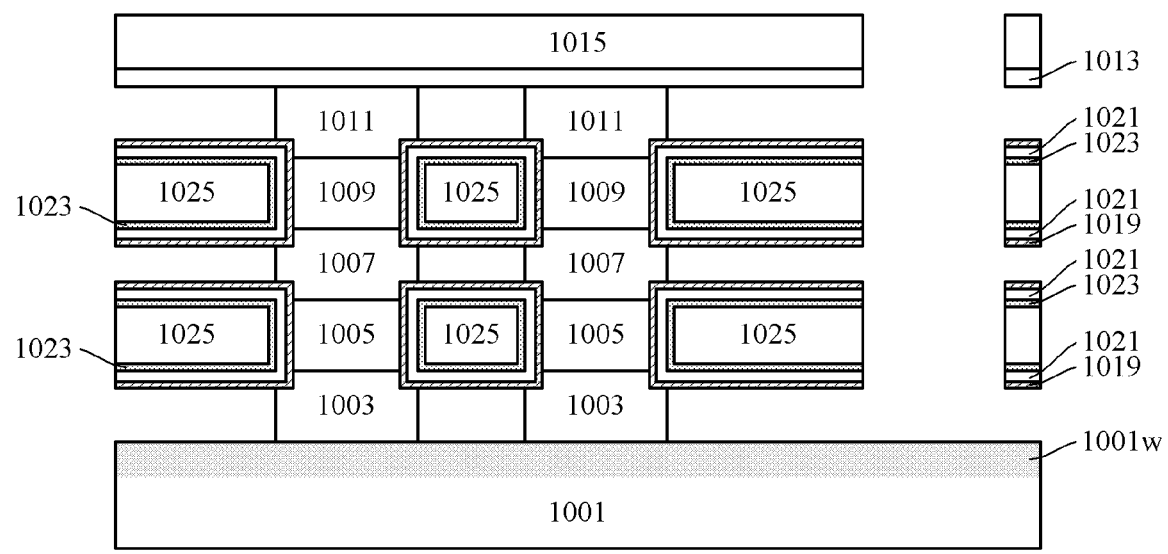
Figure 9A:
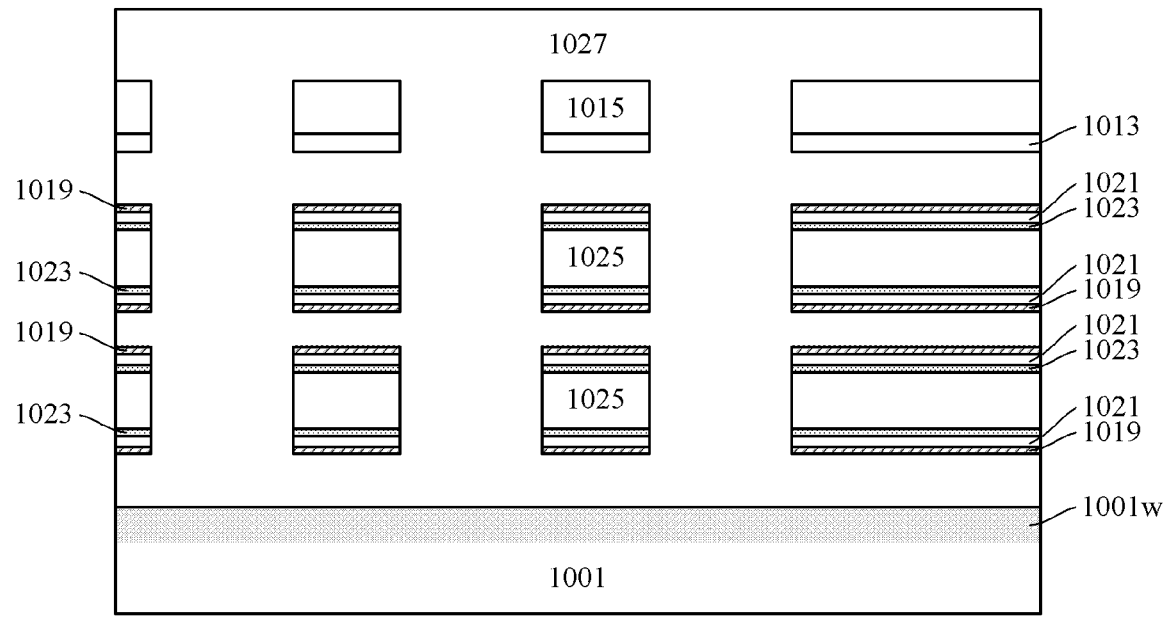
Figure 9B:
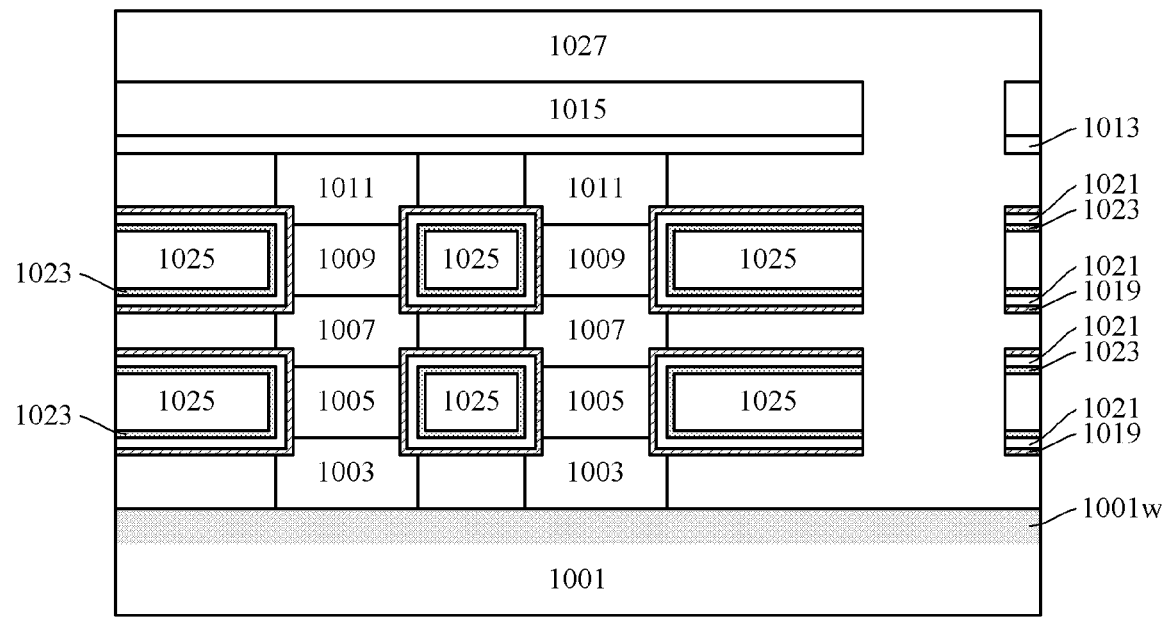
Figure 10A:
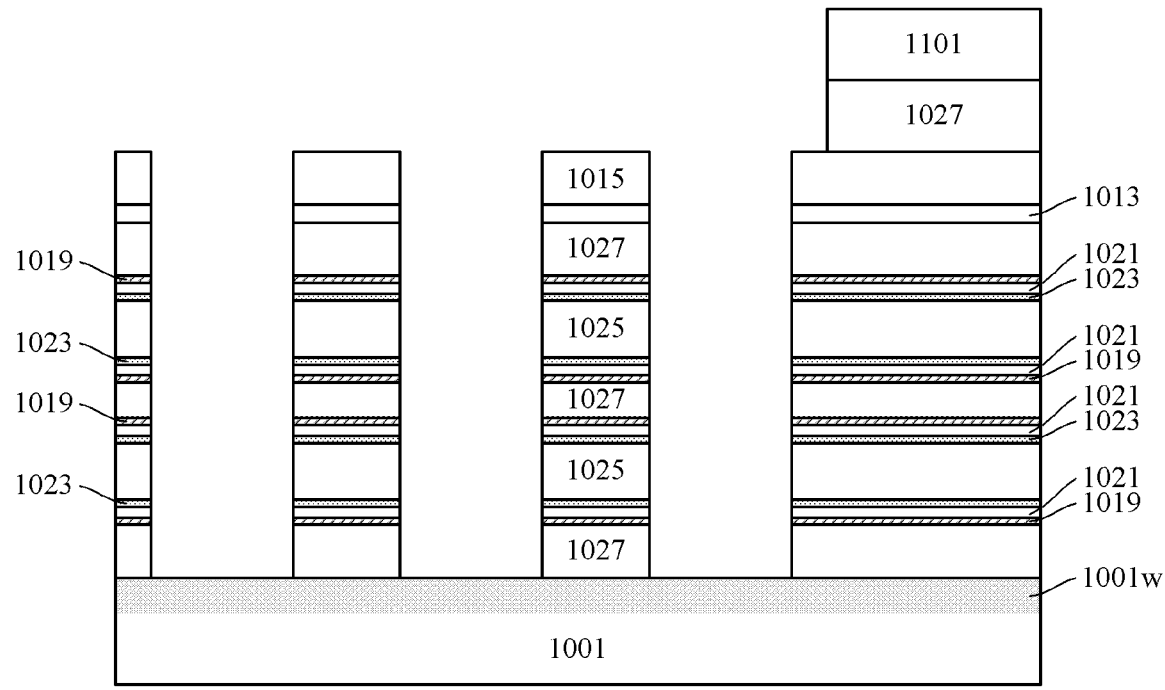
Figure 10B:
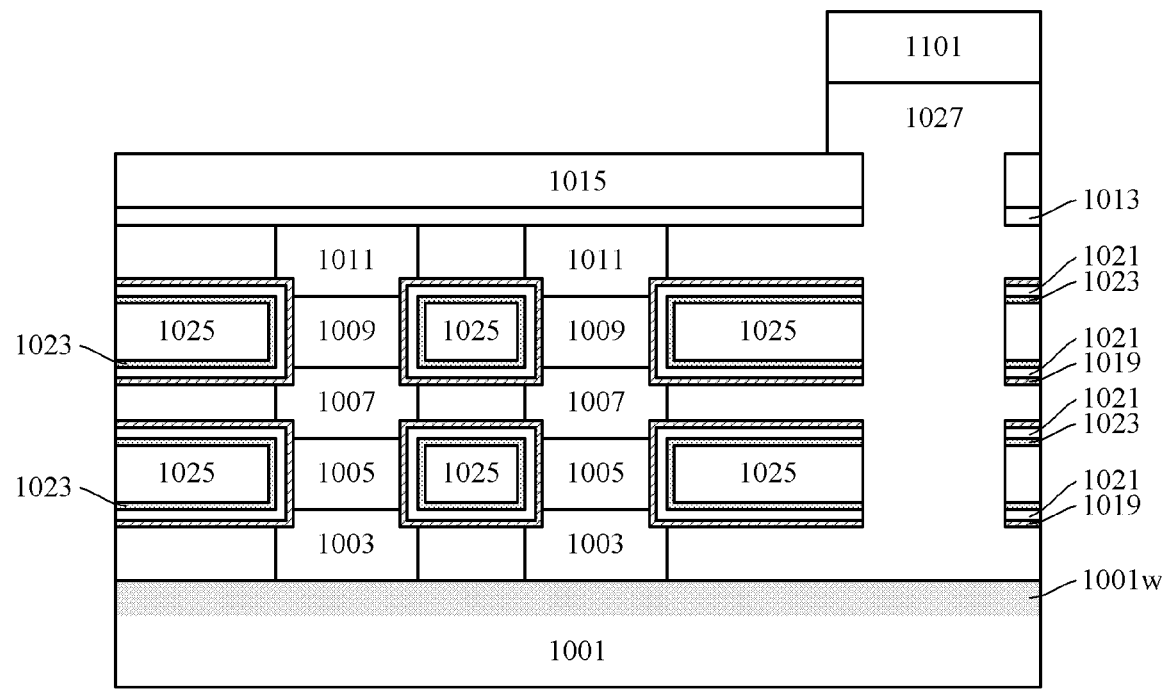
Figure 10C:
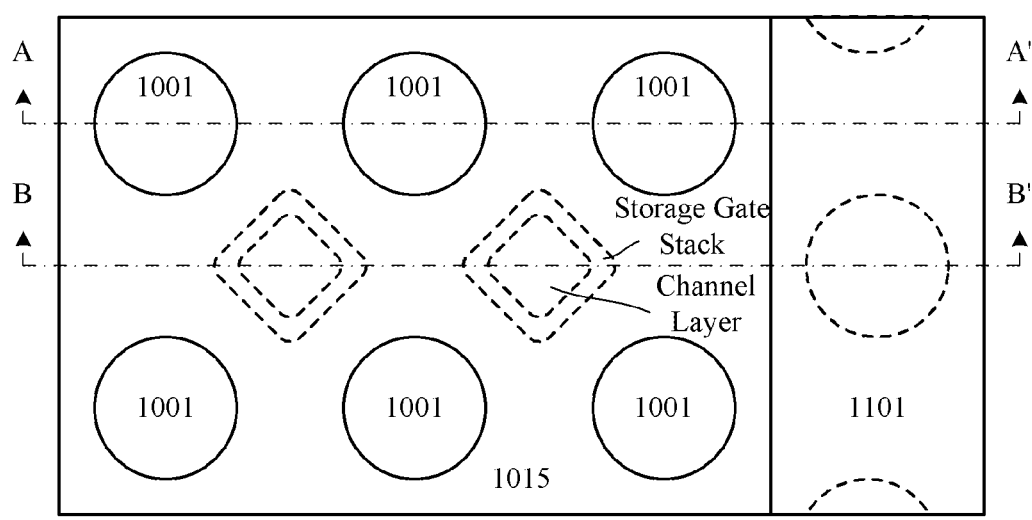
Figure 11A:
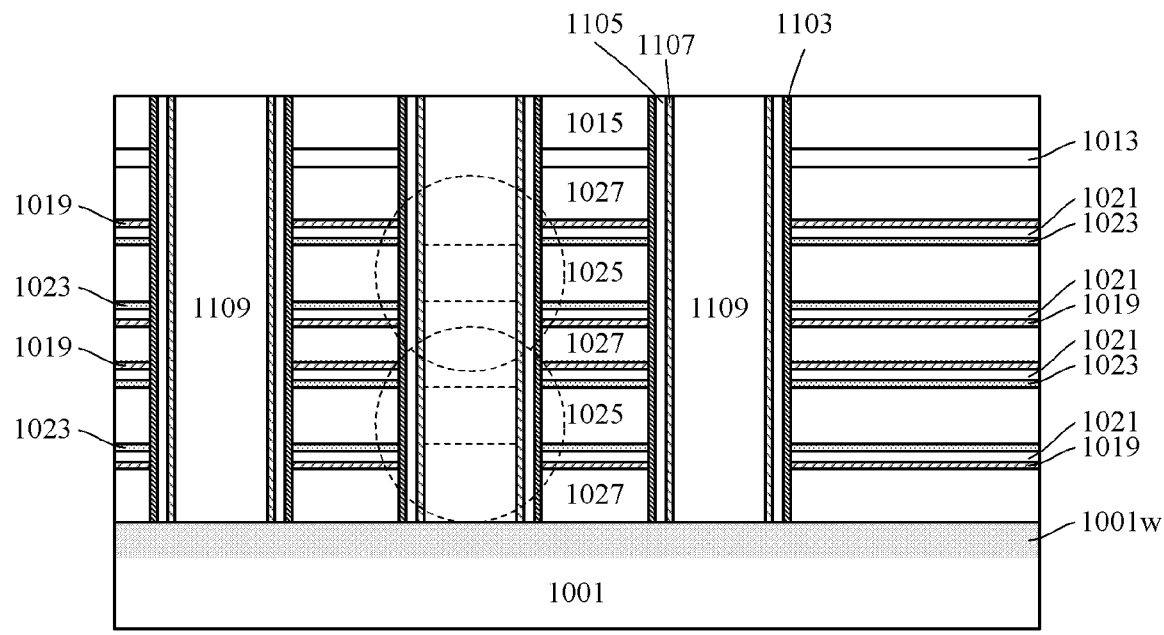
Figure 11B:
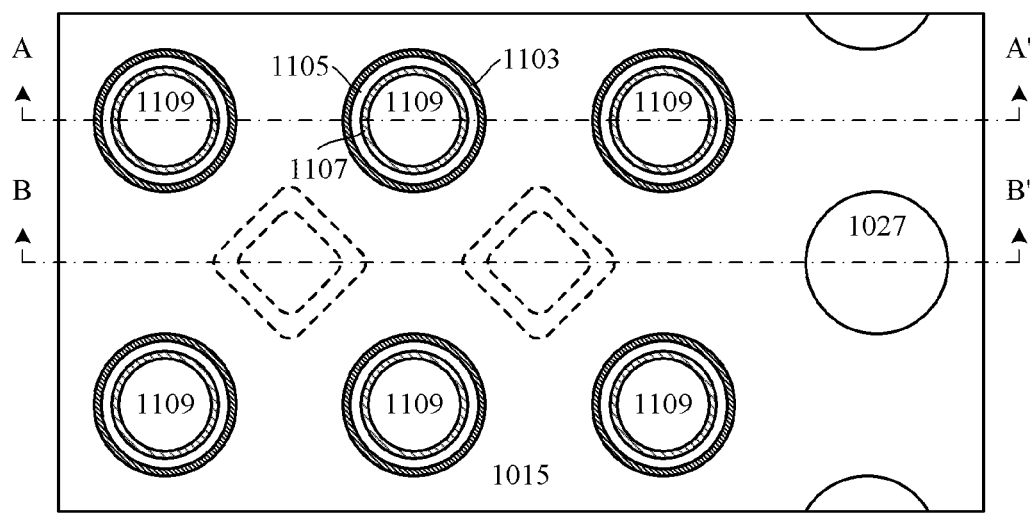

The machining holes are also filled with the gate stacks. For further operations, the machining holes may be emptied, as shown in FIGS. 7(*a*) and 7(*b*). Specifically, the gate conductor layer 1025, the second gate dielectric layer 1023, the floating gate layer or charge trapping layer 1021 and the first gate dielectric layer 1019 may be selectively etched in sequence by, for example, RIE. Due to the presence of the hard mask 1015, the gate stacks in the machining holes are removed, while the gate stacks at remaining positions, particularly in the memory cell region, are left.

Next, source/drain portions may be separated for the respective memory cells. As shown in FIGS. 8(*a*) and 8(*b*), the source/drain layers 1003, 1007 and 1011 may be selectively etched (with respect to the channel layers and the gate stacks) through the machining holes. Here, since the etching is also performed through the machining holes, as described above with reference to FIGS. 4(*a*)-4(*c*) and 17(*a*)-17(*b*), in each of the source/drain layers 1003, 1007 and 1011, some separated islands are left, which then act as cell source/drain portions for the memory cells. As described above with reference to FIGS. 17(*a*) and 17(*b*), the positions of these islands are determined by the positions of the machining holes, and therefore are substantially the same as those of the cell channel portions. That is, the cell source/drain portions are substantially aligned with the cell channel portions in the vertical direction. In addition, the amount of etching of the source/drain layers 1003, 1007 and 1011 may be relatively small, so that the cell channel portions are laterally recessed with respect to the respective cell source/drain portions.

For the p-type devices, Si is strained after the etching, because SiGe has a greater lattice constant than Si without being strained. The strain will cause a mobility of holes in Si to become greater than that if without the strain, or cause an effective mass of light holes in Si to become smaller than that if without the strain, or cause a concentration of the light holes in Si to become greater than that if without the strain, so that the p-type devices will have an increased ON current and thus have their performances improved. Alternatively, for the n-type devices, Si is strained after the etching, because Si:C has a smaller lattice constant than Si without being strained. The strain will cause a mobility of electrons in Si to become greater than that if without the strain, or cause an effective mass of the electrons in Si to become smaller than that if without the strain, so that the n-type devices will have an increased ON current and thus have their performances improved.

In addition, if SiGe is selected to be used for the channel layers and Si is selected to be used for the source/drain layers, this selection will result in not only an increased ON current but also a reduced OFF current for the p-type devices, so that the performances of the p-type devices are improved. This is because Si has a forbidden band gap greater than that of SiGe, and the mobility of holes in SiGe is higher than that in Si.

Therefore, vertical strings of memory cells are formed in the memory cell region, and each of the memory cells comprises a cell source/drain portion, a cell channel portion, and a further cell source/drain portion which are stacked in sequence. As adjacent ones of the memory cells have a shared cell source/drain portion therebetween, the memory cells in each of the strings are connected to each other in series.

In this way, the memory cells are manufactured in the memory cell region. However, at this point, spaces in the machining holes are wasted. In order to avoid such a waste, additional memory cells may be further formed in the machining holes according to an embodiment of the present disclosure. For example, this can be done as follows.

As there are still a lot of gaps in the stack as shown in FIGS. 8(*a*) and 8(*b*), a dielectric material may be filled therein to achieve structural support and required electrical isolation. For example, as shown in FIGS. 9(*a*) and 9(*b*), a dielectric material may be filled in the gaps in the stack through the machining holes to form an interlayer dielectric layer 1027. For example, oxide may be deposited by, for example, ALD or the like. Here, the interlayer dielectric layer 1027 preferably extends beyond a top surface of the hard mask 1015 and may be planarized by, for example, Chemical Mechanical Polishing (CMP).

The machining holes are also filled with the interlayer dielectric layer 1027. In order to manufacture additional memory cells in the machining holes, the machining holes may be emptied. In addition, it is desired to form additional memory cells in the memory cell region, but not in the contact region, and therefore it suffices to empty only the machining holes in the memory cell region. To this end, as shown in FIGS. 10(*a*), 10(*b*) and 10(*c*) (FIG. 10(*a*) is a cross-sectional view taken along line AA' in FIG. 10(*c*), FIG. 10(*b*) is a cross-sectional view taken along line BB' of FIG. 10(*c*), and FIG. 10(*c*) is a top view), photoresist 1101 may be formed to cover the contact region (particularly the machining holes therein), while exposing the memory cell region. Then, the interlayer dielectric layer 1027 may be selectively etched by, for example, RIE. Then, the machining holes are exposed. After that, the photoresist 1101 may be removed.

Then, as shown in FIGS. 11(*a*) and 11(*b*) (FIG. 11(*a*) is a sectional view taken along line AA' in FIG. 11(*b*), and FIG. 11(*b*) is a top view), additional vertical memory cells may be formed in the machining holes. For example, an additional first gate dielectric layer 1103, an additional charge trapping layer 1105, and an additional second gate dielectric layer 1107 may be formed in sequence around the sidewalls of the respective machining holes. Those layers extend over the sidewalls of the machining holes, and may be formed by, for example, a spacer formation process. For example, the additional first gate dielectric layer 1103 may comprise high-K gate dielectric such as $HfO_2$, with a thickness of about 1-10 nm, the additional charge trapping layer 1105 may comprise a charge trapping material such as nitride, with a thickness of about 1-20 nm, and the additional second gate dielectric layer 1107 may comprise high-K gate dielectric such as $HfO_2$, with a thickness of about 1-10 nm. As shown in the top view of FIG. 11(*b*), these layers may be formed as concentric rings (around an active semiconductor layer 1109 to be formed later). Then, the remaining spaces in the machining holes may be filled with the active semiconductor layer 1109. For example, polysilicon may be deposited in the machining holes to excessively fill up the machining holes. The polysilicon may be in-situ doped to a doping concentration of, for example, about 1E17-1E19 $cm^3$, while it is being deposited. Then, the filled polysilicon may be planarized by, for example, CMP, and the CMP may be stopped at the nitride layer 1015. Then, the active semiconductor layer 1109 is formed in the machining holes. In another embodiment, a thin active semiconductor layer in a hollow structure (not shown) with a thickness of, for example, about 10-20 nm, may be formed on the second gate dielectric layer 1107 in order to better suppress the short channel effects and improve the device performances. The hollow structure may then be filled up with a dielectric material (for example, oxide or nitride).

As indicated by the dotted circles in FIG. 11(*a*), the respective gate conductor layers 1025 may define channel regions, as indicated by the dotted blocks in the figure, in the active semiconductor layer 1109 via the additional second gate dielectric layer 1107, the additional charge trapping layer 1105, and the additional first gate dielectric layer 1103. Source/drain regions may be formed on opposite sides of the respective channel regions (for example, at positions corresponding to the interlayer dielectric layer 1027, that is, positions where the original source/drain layers were located). Then, each of the channel regions and the source/drain regions on upper and lower sides thereof form an additional memory cell. The gate conductor layers 1025 are stacked in multiple levels on the substrate, resulting in a plurality of additional memory cells stacked in the vertically extending active semiconductor layer 1109, with their respective active regions extending integrally and thus connected to each other in series.

Alternatively, the storage gate stacks of the additional memory cells may comprise a ferroelectric material. For example, the gate stacks may each comprise a first metal layer, a ferroelectric material layer, a second metal layer, a gate dielectric layer, and a gate conductor layer (not shown) which are stacked in sequence. For example, the ferroelectric material may comprise hafnium oxide such as $HfO_2$, zirconium oxide such as $ZrO_2$, tantalum oxide such as $TaO_2$, hafnium zirconium oxide $Hf_xZr_{1-x}O_2$ (wherein x is in a range of 0 to 1) such as $Hf_{0.5}Zr_{0.5}O_2$, hafnium tantalum oxide $Hf_xTa_{1-x}O_2$ (wherein x is in a range of 0 to 1) such as $Hf_{0.5}Ta_{0.05}O_2$, Si-containing $HfO_2$, Al-containing $HfO_2$, $BaTiO_3$, $KH_2PO_4$ or SBTi, and the first metal layer and the second metal layer may each comprise TiN. In this case, the gate dielectric layer, the second metal layer, the ferroelectric material layer and the first metal layer may be formed in sequence on the sidewalls of the machining holes, each in a form of, for example, spacer. In addition, an active semiconductor layer such as polysilicon may be filled in a space surrounded by these layers. The gate conductor layer may be a shared one as described above.

In this way, the memory cells are manufactured in the memory cell region. Subsequently, various electrical contacts may be manufactured to achieve desired electrical connections.

Figure 12A:
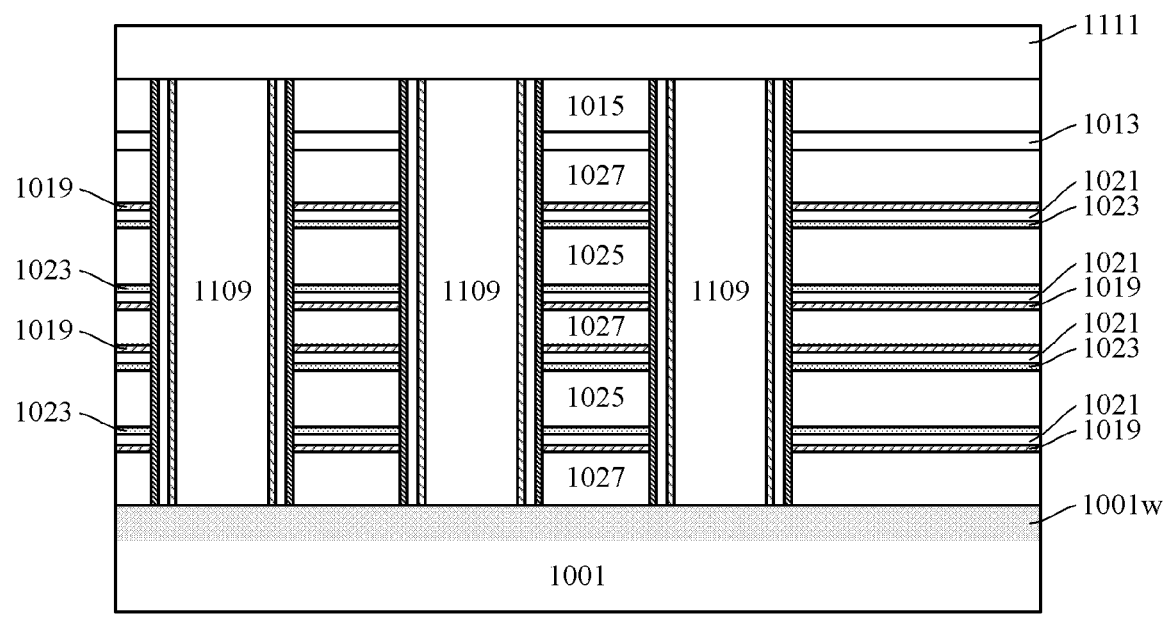
Figure 12B:
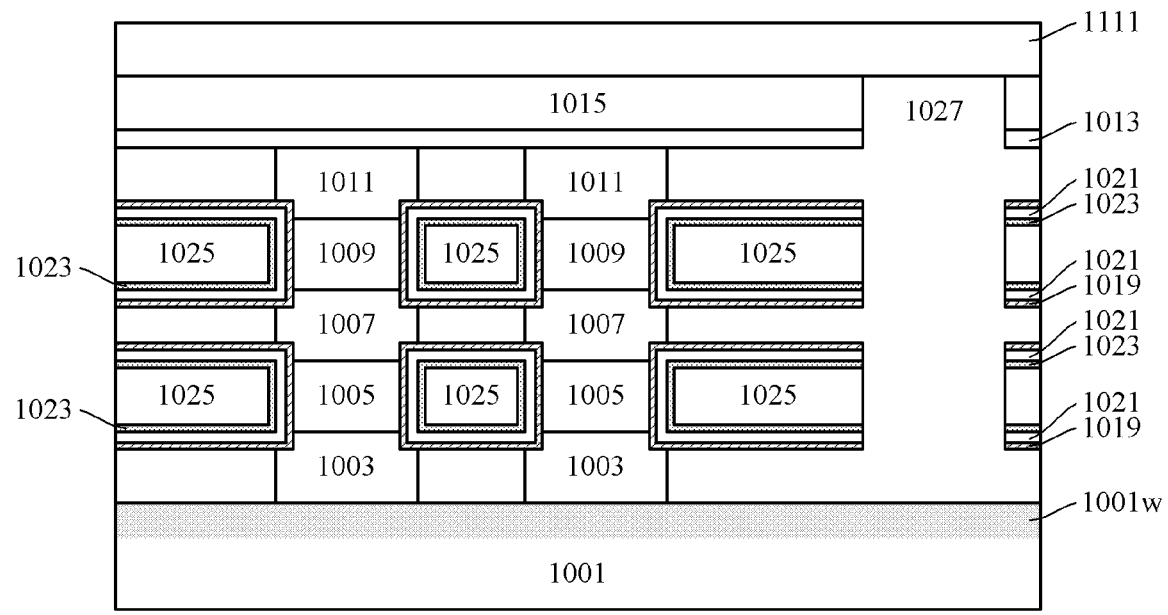

In order to protect the memory cells, particularly the additional memory cells formed in the machining holes (since upper ends thereof are currently exposed), as shown in FIGS. 12(*a*) and 12(*b*) (FIGS. 12(*a*) and 12(*b*) are sectional views taken along lines AA' and BB' in FIG. 11(*b*), respectively), a protection layer 1111 may be formed on the structure shown in FIGS. 11(*a*) and 11(*b*). For example, nitride with a thickness of about 5-150 nm may be deposited to form the protection layer 1111.

Next, electrical contacts may be formed in the interlayer dielectric layer 1027. For a three-dimensional array, there are various ways in the art to make interconnections. For example, the gate stacks in the contact region may be patterned to have a stepped structure, to form electrical contacts to the respective layers of the gate stacks. A specific example will be described below.

Figure 13A:
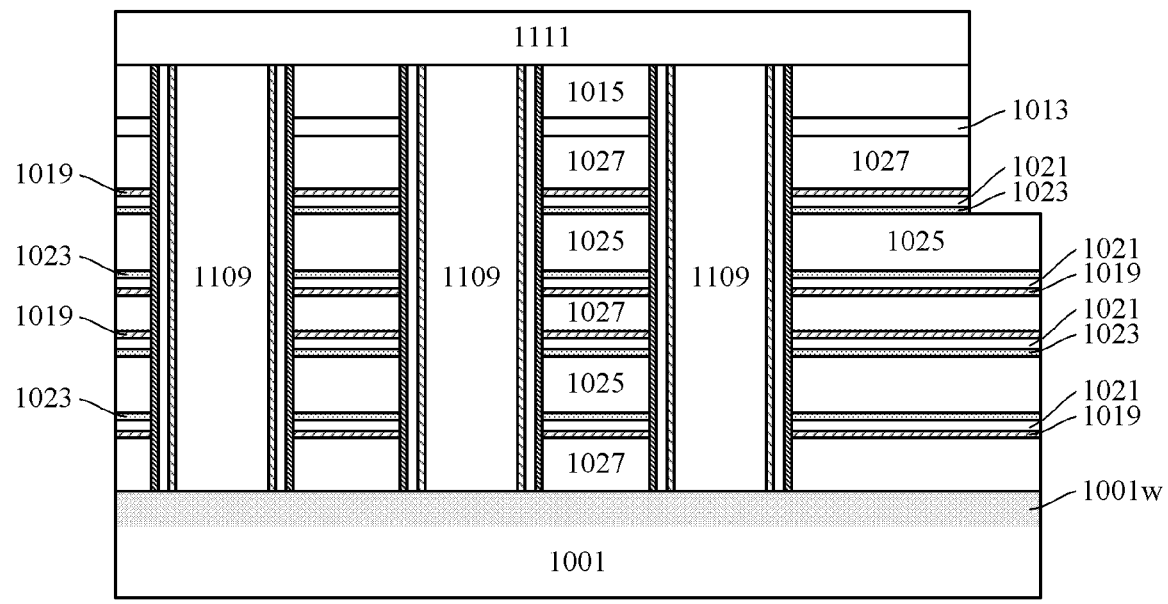
Figure 13B:
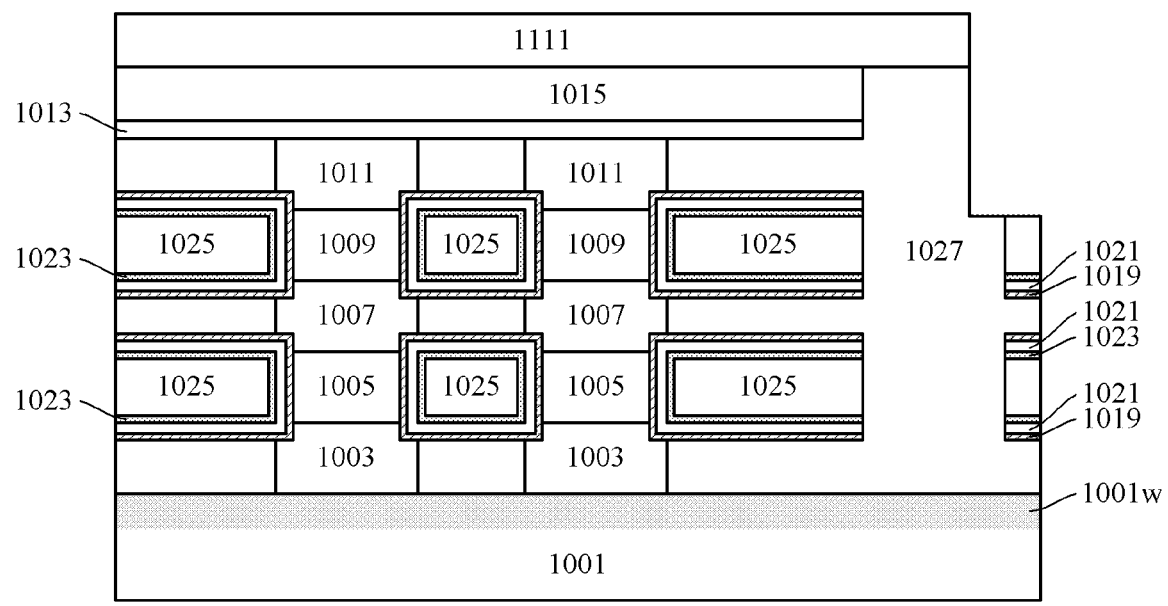
Figure 14A:
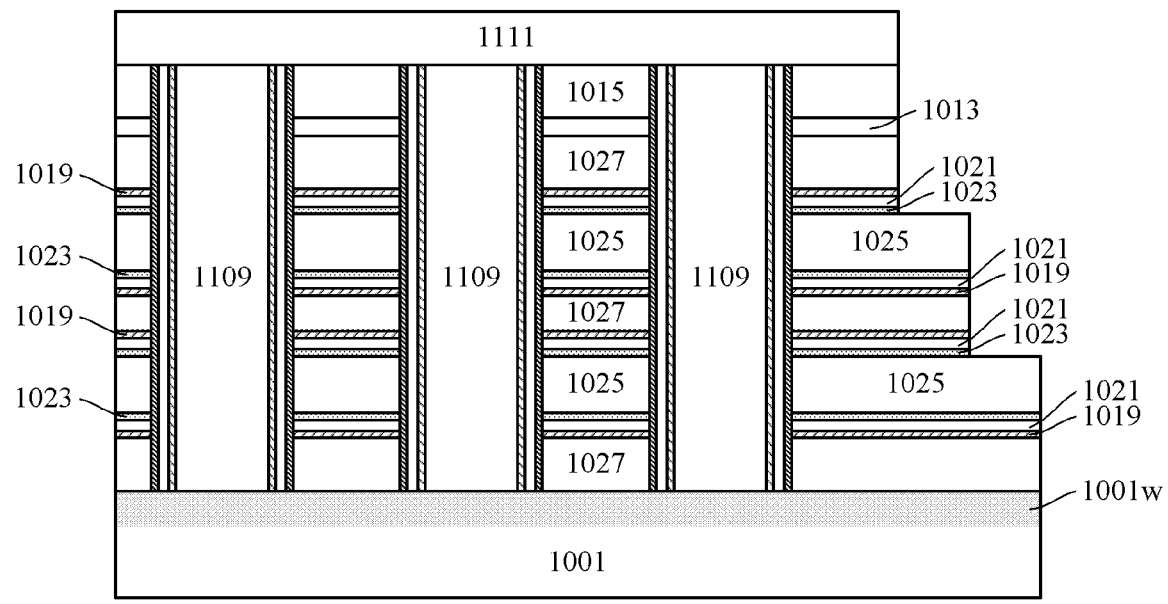
Figure 14B:
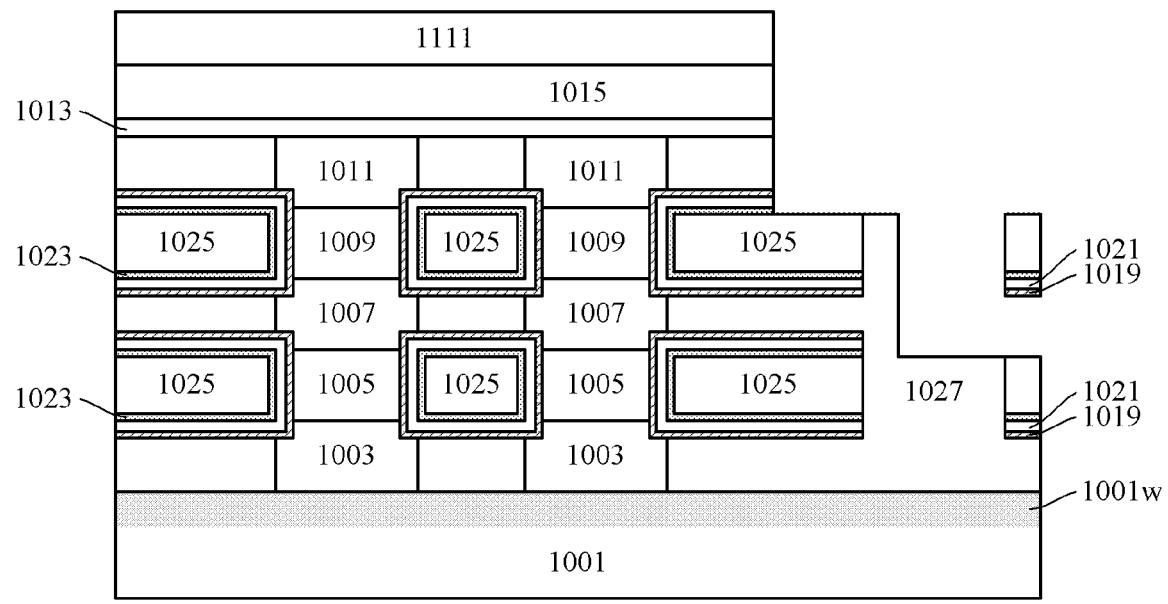
Figure 15A:
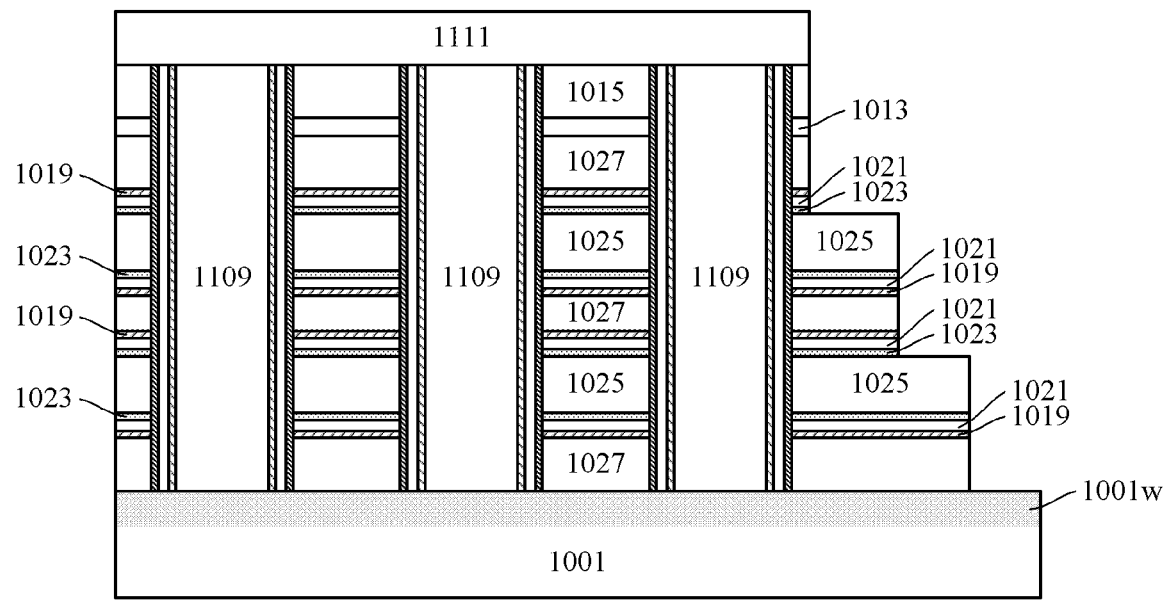
Figure 15B:
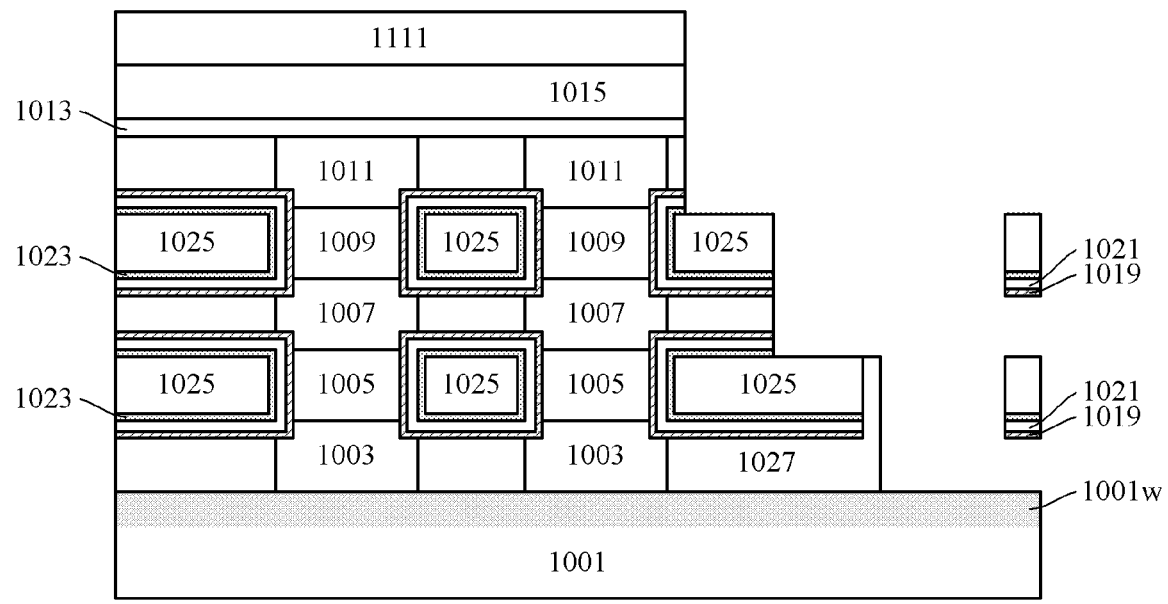

For example, as shown in FIGS. 13(*a*) and 13(*b*), the respective material layers on the uppermost gate conductor layer 1025 may be selectively etched by, for example, RIE, with the aid of photoresist (not shown). Then, as shown in FIGS. 14(*a*) and 14(*b*), the photoresist may be trimmed so as to be retracted towards the memory cell region and the respective material layers on the uppermost gate conductor layer 1025 may be selectively etched by, for example, RIE. Next, as shown in FIGS. 15(*a*) and 15(*b*), the photoresist may be further trimmed so as to be further retracted towards the memory cell region and the respective material layers on the uppermost gate conductor layer 1025 may be selectively etched by, for example, RIE. In this way, the gate conductor layers are formed to have a stepped structure. There are various ways in the art to pattern multiple vertically-stacked layers into a stepped structure at edges thereof, and detailed descriptions thereof are omitted here.

Figure 16A:
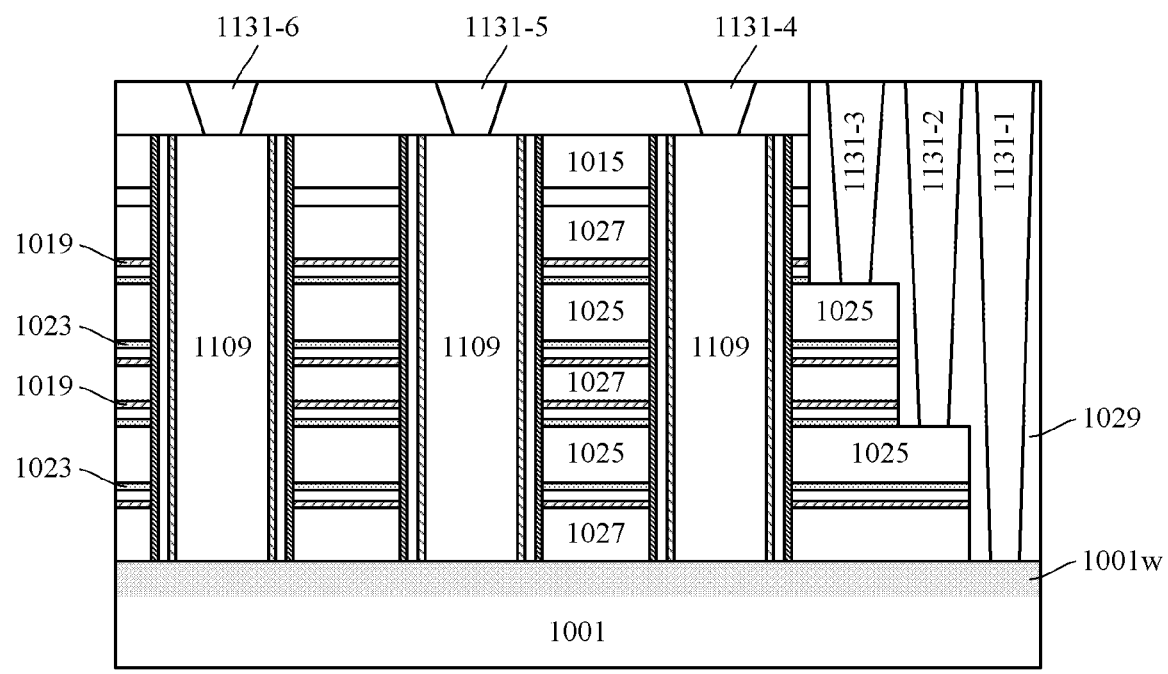
Figure 16B:
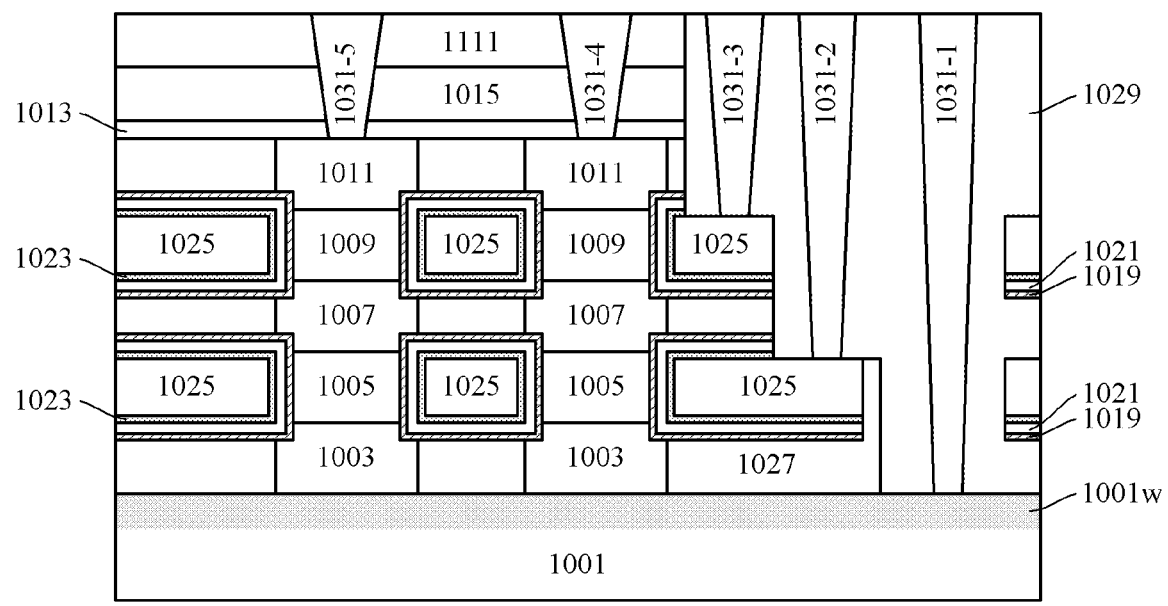

As shown in FIGS. 16(*a*) and 16(*b*), a dielectric material (which is, for example, the same material as that of the interlayer dielectric layer 1027) may be deposited to form, together with remaining interlayer dielectric layer 1027, an interlayer dielectric layer 1029. Electrical contacts 1031-1 and 1131-1 to the common ground potential plane 1001*w* (and thus to all the source/drain regions of the lowermost layer of memory cells), electrical contacts 1031-2, 1031-3, 1131-2 and 1131-3 to the respective gate conductor layers 1025, and electrical contacts 1031-4, 1031-5, 1131-4, 1131-5 and 1131-6 to the respective source/drain regions of the uppermost layer of memory cells may be formed in the interlayer dielectric layer 1029. Such electrical contacts may be made by forming contact holes in the interlayer dielectric layer and filling a conductive material such as W therein.

In FIGS. 16(*a*) and 16(*b*), the electrical contacts 1031-2, 1031-3, 1131-2 and 1131-3 are shown respectively for the respective gate conductor layers of the first memory cells and the respective gate conductor layers of the second memory cells. However, as described above, the gate conductors in the same layer are integral, and therefore for these gate conductors, it suffices to provide a single electrical contact. The same is true for the common potential plane 1001*w*.

Then, the memory device according to the embodiment is obtained. As shown in FIGS. 16(*a*) and 16(*b*), the memory device may comprise multiple layers of memory cells (in this example, only two layers are shown). Each layer of memory cells comprises a first array of first memory cells and a second array of second memory cells. As illustrated above in connection with FIGS. 17(*a*) and 17(*b*), the first array and the second array are nested with one another.

As shown in FIG. 16(*b*), each of the first memory cells comprises a stack of a cell source/drain portion, a cell channel portion, and a cell source/drain portion. The first memory cells are connected to form strings in the vertical direction, each of which is connected to a corresponding one of the electrical contacts at an upper end thereof and also to the common ground plane at a lower end thereof. The respective gate stacks of the first memory cells in each layer are integral.

As shown in FIG. 16(*a*), each of the second memory cells comprises a channel region defined in the active semiconductor layer 1109 by a corresponding one of the gate conductors 1025 and source/drain regions on opposite sides of the channel region. The respective second memory cells in the same active semiconductor layer 1019 extending in the vertical direction are connected to form a string in the vertical direction, which is connected to a corresponding one of the electrical contacts at an upper end thereof and also to the common ground potential plane at a lower end thereof. The gate conductor for each layer of the second memory cells is provided by that for the first memory cells in this layer.

A specific layer of memory cells may be selected by an electrical contact to a corresponding one of the gate conductors. In addition, a specific string of memory cells may be selected by a corresponding one of the contacts to the source/drain regions.

In this example, the electrical contacts are formed for the source/drain regions of all the memory cells in the uppermost layer. Due to a great density of the memory cells, a density of such source/drain contacts is great. According to another embodiment, it is possible to form electrodes arranged in rows (or columns) and electrically connected to the source/drain regions of the lowermost layer of memory cells and also electrodes arranged in columns (or rows) and electrically connected to the source/drain regions of the uppermost layer of memory cells. In this way, the respective strings of memory cells may be selected by the electrodes on upper and lower sides thereof (which intersect with each other to form an array corresponding to the array of memory cells).

In the above embodiments, the second storage gate stacks (except for the gate conductors) are shown as continuously extending on the sidewalls of the respective machining holes. However, the present disclosure is not limited thereto. For example, they may be formed as multiple layers which are separated from each other, each of which layers corresponds to a corresponding one of the layers of first storage gate stacks, particularly in a case that the second storage gate stacks each comprise a ferroelectric material or a floating gate layer.

FIGS. 18(a)-23(b) are schematic views showing some stages in a flow of manufacturing a memory device according to another embodiment of the present disclosure. In the following, descriptions will focus on differences of this embodiment from the above embodiments.

Figure 18A:
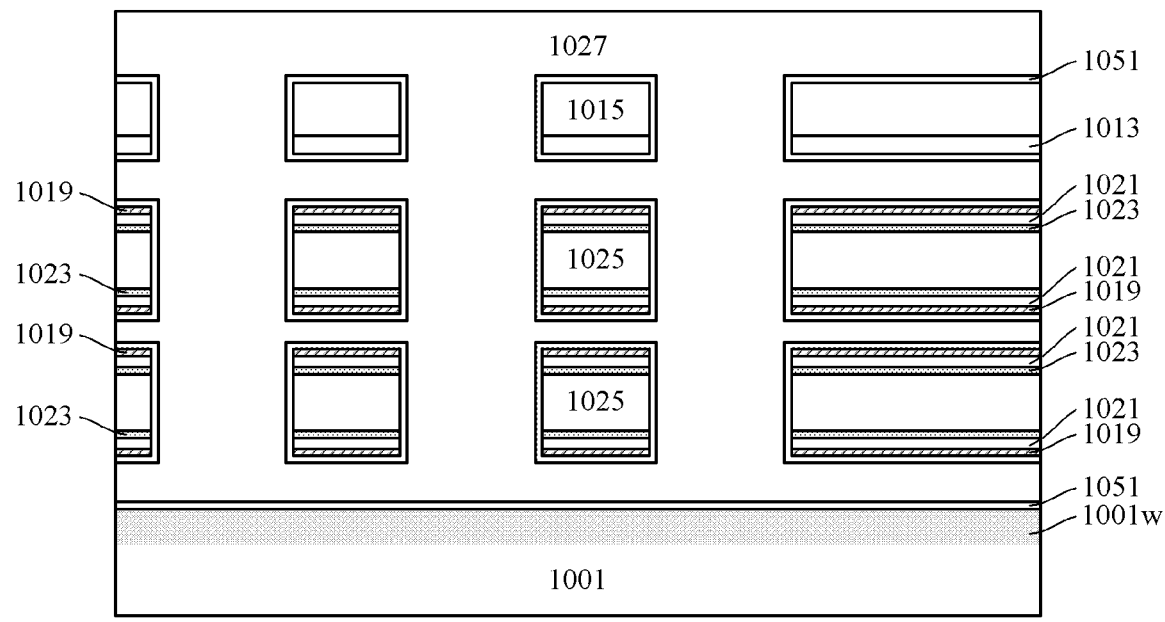
FIGS. 18(a)-23(b) are schematic views showing some stages in a flow of manufacturing a memory device according to another embodiment of the present disclosure.
Figure 18B:
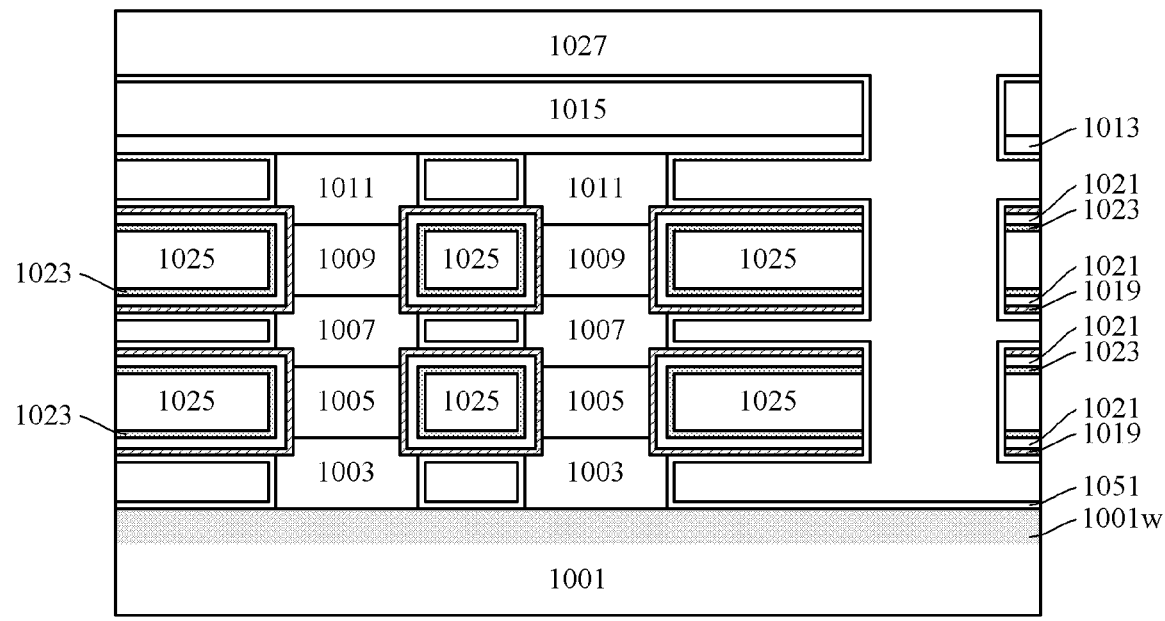

After the source/drain portions of the respective first memory cells are separated as described above in connection with FIGS. 8(a) and 8(b), a protection layer 1051 may be formed on surfaces of the gaps in the stack through the machining holes, as shown in FIGS. 18(a) and 18(b). For example, a thin nitride layer with a thickness of about 1-5 nm may be deposited. The protection layer 1051 may protect the gate stacks of the first memory cells in a later process of the gate stacks of the second memory cells. After that, as described above in connection with FIGS. 9(a) and 9(b), a dielectric material may be filled in the gaps in the stack through the machining holes to form the interlayer dielectric layer 1027.

Figure 19A:
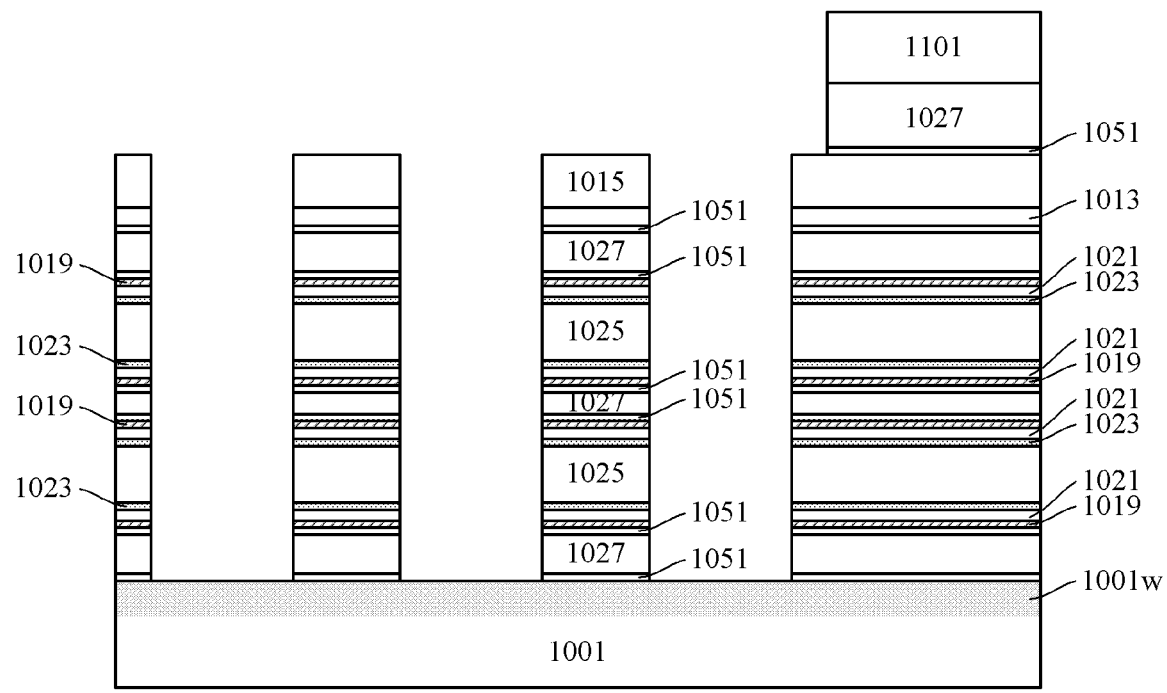
Figure 19B:
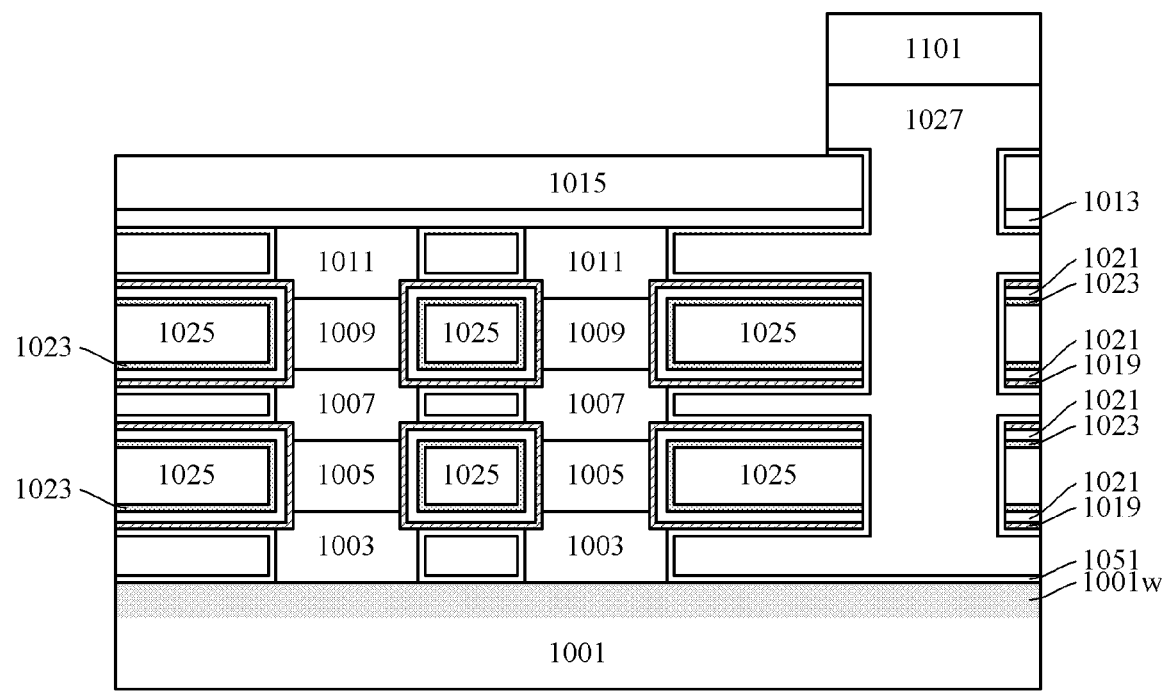

As described above in connection with FIGS. 10(a), 10(b) and 10(c), the machining holes in the memory cell region may be emptied. Here, as shown in FIGS. 19(a) and 19(b), after the interlayer dielectric layer 1027 is selectively etched by, for example, RIE, using the mask 1101 to expose the machining holes, the protection layer 1051 may be further selectively etched by, for example, RIE. In this way, portions of the protection layer 1051 extending on the sidewalls of the machining holes (in the memory cell region) may be removed while the remaining portions of the protection layer 1051 may be left as they are covered. In particular, as shown in FIG. 19(b), the gate stacks (1019/1021/1023) of the first memory cells are covered by the protection layer 1051. After that, the photoresist 1101 may be removed.

Figure 20A:
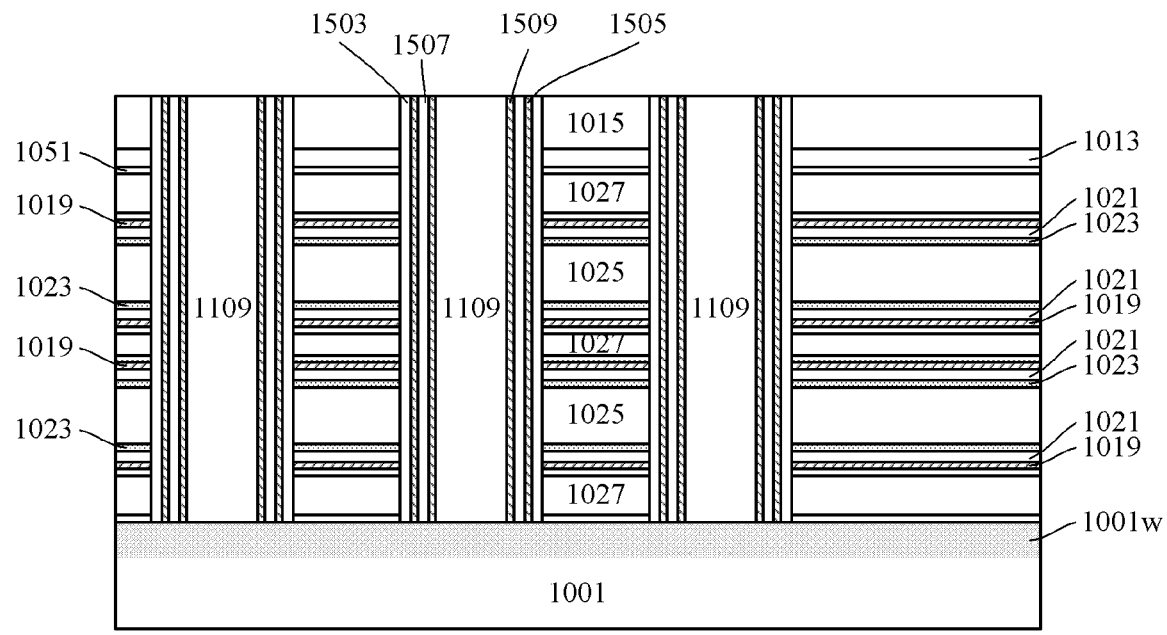
Figure 20B:
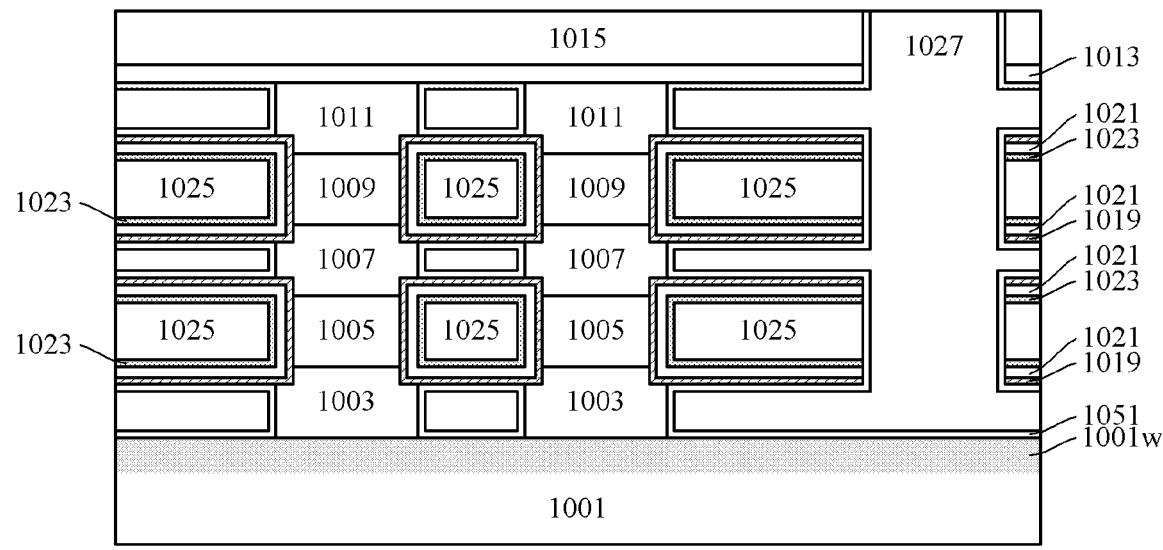

Then, as shown in FIGS. 20(a) and 20(b), additional vertical memory cells may be formed in the machining holes. The forming of the additional memory cells may be substantially the same as that described above in connection with FIGS. 11(a) and 11(b). However, in this example, different gate stacks are formed. For example, a gate dielectric layer 1503, a first metal layer 1505, a ferroelectric material layer 1507, and a second metal layer 1509 may be formed in sequence around the sidewalls of the respective machining holes. For example, the gate dielectric layer 1503 may comprise high-K gate dielectric with a thickness of about 1-10 nm, the first metal layer 1505 may comprise TiN with a thickness of about 1-10 nm, the ferroelectric material layer 1507 may comprise $Hf_{1-x}Zr_xO_2$ with a thickness of about 1-20 nm, and the second metal layer 1509 may comprise TiN with a thickness of about 1-10 nm. In addition, the active semiconductor layer 1109 filled in the machining holes may comprise polysilicon with a doping concentration of about 1E16-1E19 $cm^{-3}$.

Here, as shown in FIG. 20(a), the metal layers 1505 and 1509 which extend integrally may cause electrical problems. To this end, they may be separated into segments, respectively.

Figure 21A:
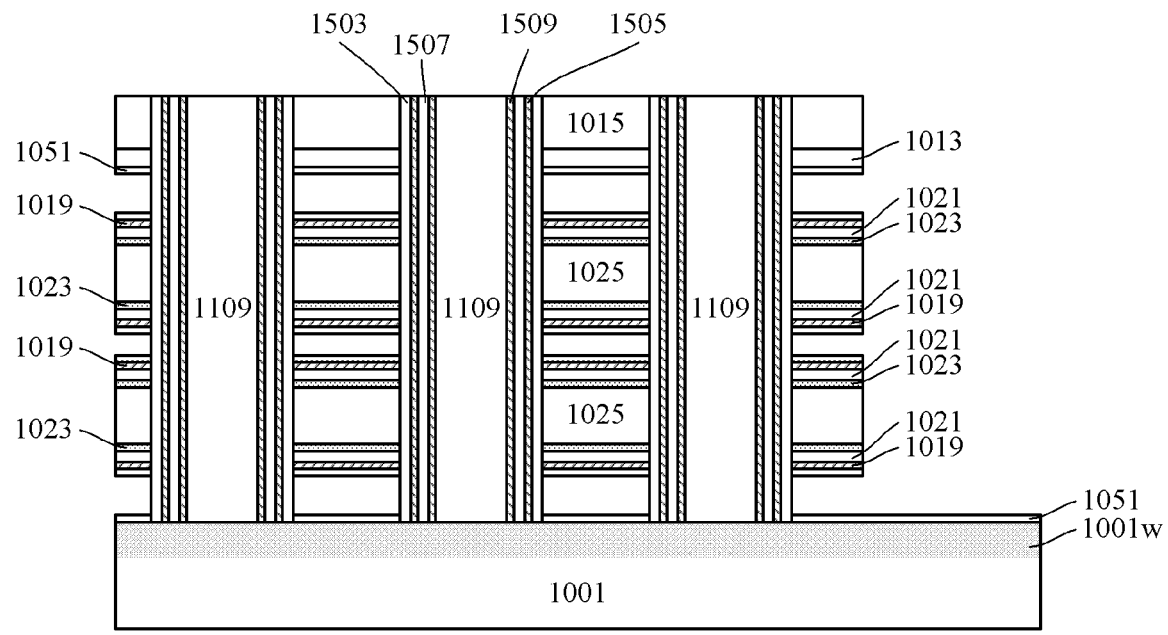
Figure 21B:
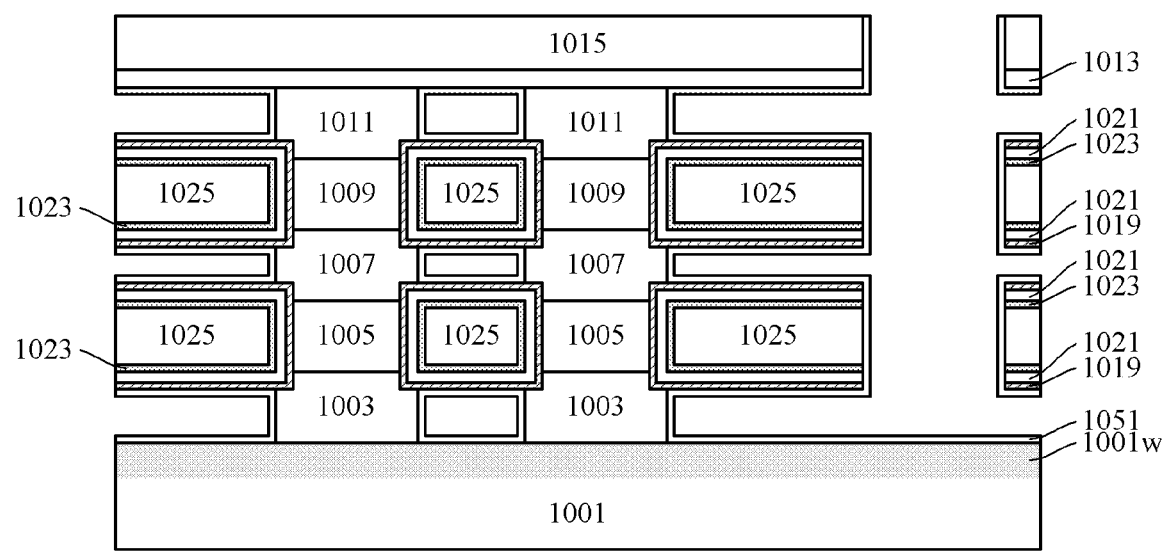

In order to enable the processing of the gate stacks for the additional memory cells, a trench, as a working path, which enables exposure of sidewalls of the interlayer dielectric layer 1027 in the stack, may be formed at a position outside the active region, and preferably, at an edge of the memory cell region, for example, at a boundary between the memory cell region and the contact region. For example, this can be achieved by photolithography. Then, the interlayer dielectric layer 1027 may be selectively etched (for example, isotropically etched) through the trench to remove the interlayer dielectric layer 1027, as shown in FIGS. 21(a) and 21(b). Here, the protection layer 1051 may protect most of the material layers. In addition, as shown in FIG. 21(a), the second storage gate stacks are exposed between the respective first storage gate stacks.

Figure 22:
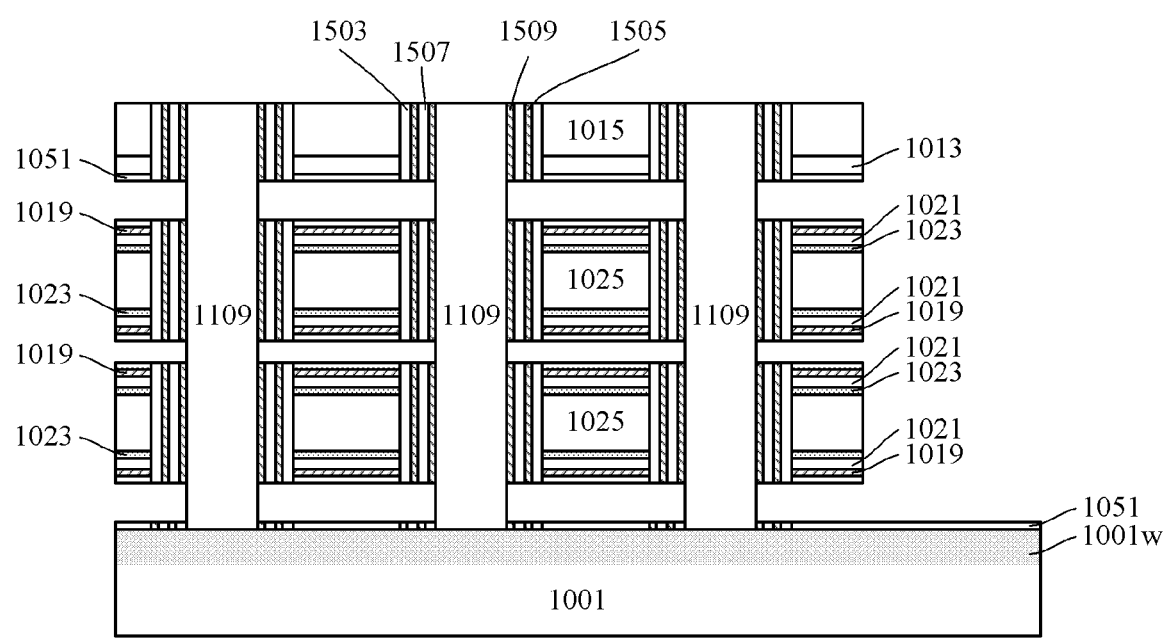

Then, as shown in FIG. 22, the gate dielectric layer 1503, the first metal layer 1505, the ferroelectric material layer 1507 and the second metal layer 1509 may be selectively etched through the trench. In this way, the second gate stacks may be separated into multiple layers corresponding to respective layers of first gate stacks. Due to the presence of the protection layer 1051, the etching may have substantially no effects on the first gate stacks.

Figure 23A:
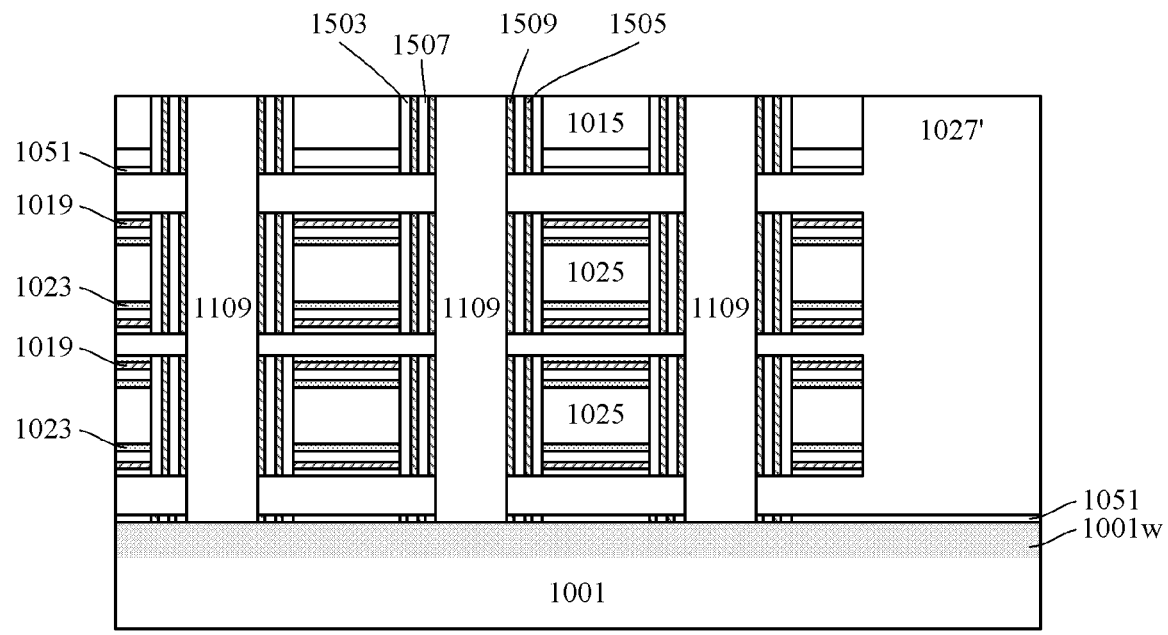
Figure 23B:
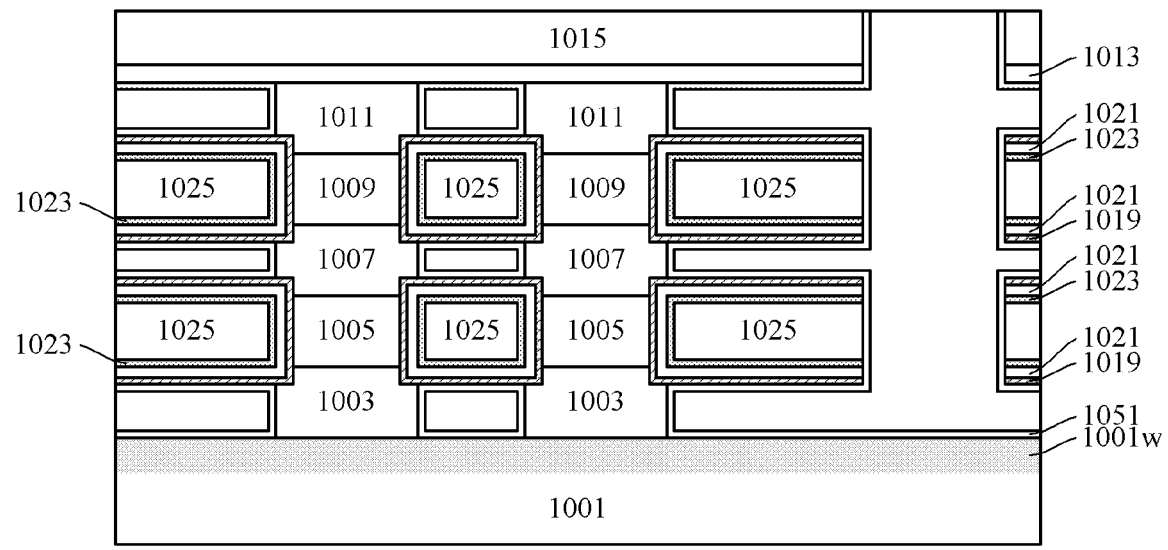

Then, as shown in FIGS. 23(a) and 23(b), the gaps in the stack may be filled with a dielectric material through the trench to form an interlayer dielectric layer 1027', for structural support and desired electrical isolation. To this end, reference may be made to the descriptions above in connection with FIGS. 9(a) and 9(b).

Subsequent operations may be the same as those in the above embodiments, and details thereof are omitted here.

In addition, according to embodiments of the present disclosure, selection transistors may be further incorporated at the uppermost ends and/or the lowermost ends of each string of the first memory cells and/or each string of the second memory cells, and details thereof are omitted here. These selection transistors may also be vertical devices.

The memory devices according to the embodiments of the present disclosure are applicable to various electronic devices. For example, the memory device may store various programs, applications and data required for operations of the electronic device. The electronic device may further comprise a processor operatively coupled to the memory device. For example, the processor may allow the programs stored in the memory device to operate the electronic device. Such an electronic device may be, for example, a smart phone, a computer, a tablet Personal Computer (PC), a wearable intelligence device, a mobile supply, or the like.

In the above descriptions, techniques such as patterning, etching or the like of various layers are not described in detail. It is to be understood by those skilled in the art that various technical measures may be utilized to form the layers, regions or the like in desired shapes. Further, in order to form the same structure, those skilled in the art can devise processes not completely the same as those described above. The mere fact that the respective embodiments are described separately above does not necessarily mean that measures in the respective embodiments cannot be used in combination to advantage.

The embodiments of the present disclosure are described above. However, those embodiments are provided only for illustrative purpose, rather than limiting the scope of the present disclosure. The scope of the present disclosure is defined by the attached claims as well as equivalents thereof. Those skilled in the art can make various alternations and modifications without departing from the scope of the present disclosure, which all fall within the scope of the present disclosure.

I claim:

1. A memory device, comprising:
multiple layers of memory cells which are stacked on a substrate in sequence, wherein each of the multiple layers of memory cells comprises a first array of first memory cells and a second array of second memory cells,
wherein the first array and the second array are nested with each other, the respective first memory cells in the respective layers of memory cells are substantially aligned to each other in a stacking direction of the layers of memory cells, and the respective second memory cells in the respective layers of memory cells are substantially aligned to each other in a stacking direction of the layers of memory cells, and
wherein each of the first memory cells comprises:
a first source/drain layer, a channel layer, and a second source/drain layer which are stacked in sequence, wherein the channel layer comprises a semiconductor material different from that of the first and second source/drain layers; and
a first storage gate stack formed to surround a periphery of the channel layer,
wherein gate conductor layers in the respective first storage gate stacks in the same layer of memory cells are integral with each other, and
wherein for each of the first memory cells, the first source/drain layer thereof is integral with the second source/drain layer of a corresponding first memory cell at a lower layer, and the second source/drain layer thereof is integral with the first source/drain layer of a corresponding first memory cell at an upper layer,
wherein each of the second memory cells comprises:
an active semiconductor layer; and
a second storage gate stack formed to surround a periphery of the active semiconductor layer,
wherein for each of the second memory cells, the active semiconductor layer thereof extends integrally with the respective active semiconductor layers of a corresponding second memory cell at a lower layer and a corresponding second memory cell at an upper layer, and
wherein in the same layer of memory cells, the first storage gate stacks and the second storage gate stacks comprise a common gate conductor layer.

2. The memory device according to claim 1, wherein
each of the first storage gate stacks comprises a first gate dielectric layer, a floating gate layer or charge trapping layer, a second gate dielectric layer and a gate conductor layer which are stacked in sequence, and
each of the second storage gate stacks comprises another first gate dielectric layer, another charge trapping layer, and another second gate dielectric layer which are stacked in sequence,
wherein in the same layer of memory cells, the gate conductor layer of the first memory cells also acts as a gate conductor layer for the second memory cells.

3. The memory device according to claim 2, wherein
the channel layers of the respective first memory cells in the same layer of memory cells are located in a plane substantially parallel to a surface of the substrate, and the gate conductor layers of the respective first memory cells in the layer of memory cells extend in the plane,
the first source/drain layers of the respective first memory cells in the same layer of memory cells are located in a plane substantially parallel to the surface of the substrate, and
the second source/drain layers of the respective first memory cells in the same layer of memory cells are located in a plane substantially parallel to the surface of the substrate.

4. The memory device according to claim 2, wherein the integrally extending active semiconductor layers of the respective second memory cells extend in a direction substantially perpendicular to the surface of the substrate, and the other first gate dielectric layer, the other charge trapping layer, and the other second gate dielectric layer of each of the second memory cells extend in the direction substantially perpendicular to the surface of the substrate and form concentric rings around a corresponding one of the active semiconductor layers.

5. The memory device according to claim 4, wherein the active semiconductor layers each have a ring shape which has an axis extending in the direction substantially perpendicular to the surface of the substrate.

6. The memory device according to claim 1, wherein the channel layer of the first memory cell comprises a monocrystalline semiconductor material, and the first and second source/drain layers of the first memory cell comprises a monocrystalline semiconductor material.

7. The memory device according to claim 6, wherein the monocrystalline semiconductor material of the channel layer of the first memory cell and the monocrystalline semiconductor material of the first and second source/drain layers of the first memory cell are eutecticum.

8. The memory device according to claim 7, wherein
the monocrystalline semiconductor material of the channel layer of the first memory cell comprises Si, and the monocrystalline semiconductor material of the first and second source/drain layers of the first memory cell comprises SiGe; or
the monocrystalline semiconductor material of the channel layer of the first memory cell comprises Si, and the monocrystalline semiconductor material of the first and second source/drain layers of the first memory cell comprises Si:C; or
the monocrystalline semiconductor material of the channel layer of the first memory cell comprises SiGe, and the monocrystalline semiconductor material of the first and second source/drain layers of the first memory cell comprises Si.

9. The memory device according to claim 1, wherein the first storage gate stacks are self-aligned to the respective channel layers.

10. The memory device according to claim 1, wherein in each of the first memory cells, the channel layer has its periphery recessed inward with respect to peripheries of the first and second source/drain layers.

11. The memory device according to claim 1, wherein in each layer of memory cells, the first memory cells in the first array of first memory cells are arranged in rows and columns in a two-dimensional array, and the second memory cells in the second array of second memory cells are arranged in rows and columns in a two-dimensional array, wherein each of the first memory cells is located at an approximately center of a corresponding one of grids of the two-dimensional array of the second memory cells, and each of the second memory cells is located at an approximately center of a corresponding one of grids of the two-dimensional array of the first memory cells.

12. The memory device according to claim 1, wherein the first and second source/drain layers comprise the same semiconductor material.

13. The memory device according to claim 1, further comprising a ground potential plane to which the first source/drain layers of the respective first memory cells and the active semiconductor layers of the respective second memory cells in the lowermost layer of memory cells are commonly connected.

14. The memory device according to claim 13, wherein the ground potential plane is a doped region in the substrate.

15. The memory device according to claim 1, wherein at least one of the first storage gate stacks and the second storage gate stacks comprises a ferroelectric material.

16. The memory device according to claim 15,
wherein at least one of the first storage gate stacks and the second storage gate stacks comprises a first metal layer, a ferroelectric material layer, a second metal layer, and a gate dielectric layer which are stacked in sequence; or
wherein the first storage gate stacks each comprise a first gate dielectric layer, a floating gate layer or charge trapping layer, a second gate dielectric layer and a gate conductor layer which are stacked in sequence, and the second storage gate stacks each comprise a first metal layer, a ferroelectric material layer, a second metal layer, and a gate dielectric layer which are stacked in sequence; or
wherein the second storage gate stacks each comprise a first gate dielectric layer, a charge trapping layer and a second gate dielectric layer which are stacked in sequence, and the first storage gate stacks each comprise a first metal layer, a ferroelectric material layer, a second metal layer and a gate dielectric layer which are stacked in sequence.

17. The memory device according to claim 16, wherein the ferroelectric material comprises hafnium oxide, zirconium oxide, tantalum oxide, hafnium zirconium oxide, or hafnium tantalum oxide, and the first metal layer and the second metal layer each comprise TiN.

18. The memory device according to claim 17, wherein the hafnium oxide comprises $HfO_2$, the zirconium oxide comprises $ZrO_2$, the tantalum oxide comprises $TaO_2$, the hafnium zirconium oxide comprises $Hf_xZr_{1-x}O_2$, and hafnium tantalum oxide comprises $Hf_xTa_{1-x}O_2$, where x is in a range of 0-1.

19. The memory device according to claim 16, wherein the ferroelectric material comprises Si-containing $HfO_2$, Al-containing $HfO_2$, $BaTiO_3$, $KH_2PO_4$ or SBTi, and the first metal layer and the second metal layer each comprise TiN.

20. An electronic device, comprising the memory device according to claim 1.

21. The electronic device according to claim 20, further comprising a processor operatively coupled to the memory device.

22. The electronic device according to claim 20, wherein the electronic device comprises a smart phone, a computer, a tablet computer, a wearable intelligence device, or a mobile power supply.

23. A method of manufacturing a memory device, comprising:

providing a stack of source/drain layers and channel layers alternatively stacked on a substrate, wherein the lowermost layer of the stack is a source/drain layer, and the uppermost layer of the stack is a source/drain layer;
forming a number of machining holes in the stack;
selectively etching the channel layers in the stack through the machining holes, to form an array of multiple cell channel portions, which are separated from each other, in each of the channel layers of the stack;
forming storage gate stacks for first memory cells in gaps in the stack through the machining holes;
removing materials left after the selectively etching the channel layers in the machining holes to expose the machining holes;
selectively etching the source/drain layers in the stack through the machining holes, to form cell source/drain portions respectively on upper and lower sides of each of the cell channel portions, wherein each of the cell channel portions and the cell source/drain portions on upper and lower sides thereof form a corresponding one of the first memory cells;
forming an isolation layer in gaps in the stack through the machining holes;
removing materials left after the forming the isolation layer in the machining holes to expose the machining holes; and
forming storage gate stacks for second memory cells on sidewalls of the machining holes, and filling an active semiconductor layer for the second memory cells in the machining holes of which the sidewalls have the storage gate stacks for the second memory cells formed thereon.

24. The method according to claim 23, wherein the stack of the source/drain layers and the channel layers is provided by epitaxial growth.

25. The method according to claim 24, wherein the source/drain layers are in-situ doped while being grown, with a doping type corresponding to a conductivity type of the device.

26. The method according to claim 24, wherein the channel layer is in-situ doped while being grown, with a doping type opposite to a conductivity type of the device.

27. The method according to claim 23,
wherein the forming of the storage gate stacks for the first memory cells comprises forming a first gate dielectric layer, a floating gate layer or charge trapping layer, a second gate dielectric layer, and a gate conductor layer in sequence; and
wherein the forming of the storage gate stacks for the second memory cells comprises forming another first gate dielectric layer, another charge trapping layer and another second gate dielectric layer in sequence.

28. The method according to claim 23, further comprising forming a well in the substrate to be in electrical contact with the lowermost memory cells.

29. The method according to claim 23, wherein the substrate comprises a memory cell region and a contact region,
wherein the machining holes are provided in the memory cell region at such a density that portions of the channel layers in the memory cell region are separated into isolated islands, which constitute the cell channel portions, after the channel layers have been selectively etched through the machining holes for a given period of time, and
wherein the machining holes are provided in the contact region at such a density that substantially all portions of the channel layers in the contact region are removed after the given period of time.

30. The method according to claim 29, wherein the cell channel portions in the respective channel layers are arranged in rows and columns in a two-dimensional array, and the machining holes in the memory cell region are arranged in a further two-dimensional array corresponding to the two-dimensional array, wherein each of the cell channel portions is located at an approximate center of a corresponding one of grids in the further two-dimensional array of the machining holes.

31. The method according to claim 23, wherein before the selective etching of the channel layers and the forming of the storage gate stacks for the first memory cells, the method further comprises:
   selectively etching the source/drain layers to increase intervals between the respective source/drain layers.

32. The method according to claim 23, further comprising:
   controlling the selective etching of the source/drain layers, so that a periphery of each of the cell source/drain portions protrudes outwards with respect to a periphery of a corresponding one of the cell channel portions.

33. The method according to claim 23, wherein the forming of the storage gate stacks for the second memory cells on the sidewalls of the machining holes comprises:
   forming the storage gate stacks for the second memory cells as multiple layers of storage gate stacks which correspond to the respective layers of first storage gate stacks and are separated from each other.

34. The method according to claim 33,
wherein after the selective etching of the source/drain layers in the stack and before the forming of the isolation layer, the method further comprises forming a protection layer through the machining holes; and
wherein the forming of the storage gate stacks for the second memory cells on the sidewalls of the machining holes comprises:
   selectively etching, through the matching holes, the isolation layer and portions of the protection layer extending on the sidewalls of the machining holes;
   forming a gate dielectric layer, a first metal layer, a ferroelectric material layer, and a second metal layer for the second memory cells in sequence on the sidewalls of the machining holes;
   forming a trench to expose sidewalls of the isolation layer;
   removing the isolation layer through the trench, and selectively etching the gate dielectric layer, the first metal layer, the ferroelectric material layer, and the second metal layer for the second memory cells; and
   forming a further isolation layer in gaps in the stack through the trench.

* * * * *